US010840146B1

(12) United States Patent
Paul et al.

(10) Patent No.: US 10,840,146 B1
(45) Date of Patent: Nov. 17, 2020

(54) STRUCTURES AND SRAM BIT CELLS WITH A BURIED CROSS-COUPLE INTERCONNECT

(71) Applicant: GLOBALFOUNDRIES Inc., Grand Cayman (KY)

(72) Inventors: Bipul C. Paul, Mechanicville, NY (US); Julien Frougier, Albany, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/443,252

(22) Filed: Jun. 17, 2019

(51) Int. Cl.
| *H01L 21/8234* | (2006.01) |
| *H01L 27/11* | (2006.01) |
| *H01L 29/08* | (2006.01) |
| *H01L 29/06* | (2006.01) |
| *H01L 29/423* | (2006.01) |
| *H01L 21/02* | (2006.01) |
| *H01L 29/66* | (2006.01) |
| *H01L 29/78* | (2006.01) |
| *H01L 21/3065* | (2006.01) |
| *H01L 21/8238* | (2006.01) |
| H01L 21/762 | (2006.01) |

(52) U.S. Cl.
CPC ........ *H01L 21/823475* (2013.01); *H01L 21/02532* (2013.01); *H01L 21/3065* (2013.01); *H01L 21/823871* (2013.01); *H01L 27/1104* (2013.01); *H01L 29/0673* (2013.01); *H01L 29/0847* (2013.01); *H01L 29/42392* (2013.01); *H01L 29/6653* (2013.01); *H01L 29/6656* (2013.01); *H01L 29/66545* (2013.01); *H01L 29/66553* (2013.01); *H01L 29/66795* (2013.01); *H01L 29/785* (2013.01); *H01L 21/0217* (2013.01); *H01L 21/02164* (2013.01); *H01L 21/76224* (2013.01)

(58) Field of Classification Search
CPC ............... H01L 21/70; H01L 21/8232; H01L 29/66007
See application file for complete search history.

(56) References Cited

U.S. PATENT DOCUMENTS

| 2001/0025985 A1 | 10/2001 | Noble |
| 2007/0296002 A1* | 12/2007 | Liang ............ H01L 21/84 257/288 |
| 2010/0330775 A1 | 12/2010 | Shin et al. |

(Continued)

OTHER PUBLICATIONS

Bipul C. Paul et al., "Circuits Based on Complementary Field-Effect Transistors" filed Jan. 10, 2018 as U.S. Appl. No. 15/866,855.

*Primary Examiner* — Cheung Lee
(74) *Attorney, Agent, or Firm* — Thompson Hine LLP; Francois Pagette

(57) ABSTRACT

Structures and static random access memory bit cells including complementary field effect transistors and methods of forming such structures and bit cells. A buried cross-couple interconnect is arranged in a vertical direction beneath a first field-effect transistor and a second field-effect transistor. The buried cross-couple interconnect is coupled with a gate electrode of the first field-effect transistor, and the buried cross-couple interconnect is also coupled with a source/drain region of the second field-effect transistor.

20 Claims, 27 Drawing Sheets

(56) References Cited

U.S. PATENT DOCUMENTS

2014/0015043 A1   1/2014   Lee
2016/0049408 A1   2/2016   Jung et al.
2016/0276339 A1   9/2016   Titus et al.

* cited by examiner

US 10,840,146 B1

STRUCTURES AND SRAM BIT CELLS WITH A BURIED CROSS-COUPLE INTERCONNECT

BACKGROUND

The present invention relates to semiconductor device fabrication and integrated circuits and, more specifically, to structures and SRAM bit cells including complementary field effect transistors and methods of forming such structures and bit cells.

Static random access memory (SRAM) may be used, for example, to temporarily store data in a computer system. An SRAM device includes an array of bit cells in which each bit cell retains a single bit of data during operation. Each SRAM bit cell may have a six-transistor (6T) design that includes a pair of cross-coupled inverters providing a storage element and a pair of pass-gate transistors connecting the inverters to complementary bit lines. The pass-gate transistors are controlled by word lines, which are used to select the SRAM memory cell for read or write operations. When continuously powered, the memory state of an SRAM device persists without the need for data refresh operations.

Device structures for a field-effect transistor generally include source/drain regions and a gate electrode configured to switch carrier flow in an active channel formed in a semiconductor body between the source/drain regions. When a control voltage exceeding a designated threshold voltage is applied to the gate electrode, the flow of carriers in the channel between the source/drain regions produces a device output current.

An inverter of an SRAM bitcell may be constructed using a complementary field-effect transistor in which the source/drain regions of the different transistor types are stacked and the active channels are controlled by a shared gate electrode. Cross-couple connections are implemented by extending the gate electrode and connecting the gate electrodes of each inverter with the source/drain regions of the opposite inverter using metallization in the overlying interconnect structure. However, these cross-couple connections may require patterning of the semiconductor material grown to provide source/drain regions, and the cross-couple connections may contribute to enlarging the size of the bitcell.

Improved structures and SRAM bit cells including complementary field effect transistors and methods of forming such structures and bit cells are needed.

SUMMARY

In embodiments of the invention, a structure includes a first field-effect transistor having a gate electrode, a second field-effect transistor having a source/drain region, and a buried cross-couple interconnect arranged in a vertical direction beneath the first field-effect transistor and the second field-effect transistor. The buried cross-couple interconnect is coupled with the gate electrode of the first field-effect transistor, and the buried cross-couple interconnect is also coupled with the source/drain region of the second field-effect transistor.

In embodiments of the invention, a method includes forming a first sacrificial layer, a second sacrificial layer, and a third sacrificial layer between the first sacrificial layer and the second sacrificial layer. The first sacrificial layer and the second sacrificial layer are replaced with a dielectric material to respectively form a first dielectric layer and a second dielectric layer. After replacing the first sacrificial layer and the second sacrificial layer with the dielectric material, the third sacrificial layer is replaced with a conductor to form a buried cross-couple interconnect coupled with a gate electrode of a first field-effect transistor. The method further includes forming a source/drain region of a second field-effect transistor over the second dielectric layer, and forming a contact coupling the buried cross-couple interconnect with the source/drain region of the second field-effect transistor.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

FIGS. 4A-15A are cross-sectional views of the device structure of FIG. 3A at successive fabrication stages subsequent to the fabrication stage of FIG. 3A.

FIGS. 4B-15B are cross-sectional views of the device structure of FIG. 3B at successive fabrication stages subsequent to the fabrication stage of FIG. 3B.

FIG. 5C is a simplified diagrammatic top view of the device structure of FIGS. 5, 5A, 5B in which FIG. 5 is taken generally along line 5-5.

FIG. 10C is a simplified diagrammatic top view of the device structure of FIGS. 10, 10A, 10B in which FIG. 10 is taken generally along line 10-10.

FIG. 12C is a simplified diagrammatic top view of the device structure of FIGS. 12, 12A, 12B in which FIG. 12 is taken generally along line 12-12.

FIG. 14C is a simplified diagrammatic top view of the device structure of FIGS. 14, 14A, 14B in which FIG. 14 is taken generally along line 14-14.

DETAILED DESCRIPTION

Figure 1:
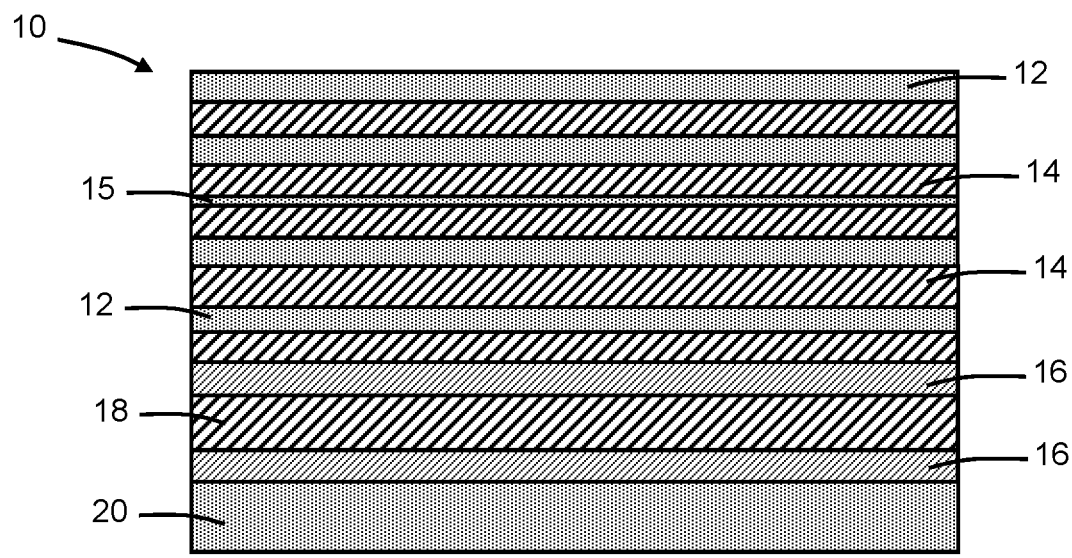
FIG. 1 is a cross-sectional view of a device structure at an initial fabrication stage of a processing method in accordance with embodiments of the invention.

With reference to FIG. 1 and in accordance with embodiments of the invention, a layer stack 10 includes nanosheet channel layers 12, sacrificial layers 14, sacrificial layers 16, and a sacrificial layer 18 arranged between the sacrificial layers 16. A centrally-located pair of adjacent, nearest-neighbor sacrificial layers 14 in the layer stack 10 is separated by a thin layer 15 composed of the same semiconductor material as the nanosheet channel layers 12. The layer stack 10 is arranged on a substrate 20 with the sacrificial layers 16, 18 arranged in a vertical direction between the layers 12, 14 and the substrate 20. The nanosheet channel layers 12 and the sacrificial layers 14, 16, 18 may be sequentially formed by an epitaxial growth process with the composition alternated during growth through a selection of the reactants to provide the alternating arrangement. The substrate 20 may be composed of a single-crystal semiconductor material, such as single-crystal silicon, that enables the epitaxial growth by providing a crystal structure template for the epitaxial growth.

The sacrificial layers 16 may be removed by an etching process selective to the nanosheet channel layers 12 and the sacrificial layers 14, 18, and the sacrificial layers 14 and the sacrificial layer 18 may be removed by an etching process selective to the nanosheet channel layers 12. The etch selectivity may be provided by providing differences in composition between the different layers 12, 14, 16, 18. The nanosheet channel layers 12 are composed of a semiconductor material, and the sacrificial layers 14 and the sacrificial layer 18 are composed of different semiconductor materials that are chosen to be selectively removed to the semiconductor material of the nanosheet channel layers 12. The sacrificial layer 18 is composed of a semiconductor material, and the sacrificial layers 16 are composed of a different semiconductor material that is chosen to be selectively removed to the semiconductor material of the sacrificial layer 18. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

In an embodiment, the nanosheet channel layers 12 may be composed of silicon, and the sacrificial layers 14, 16, 18 may be composed of silicon germanium (SiGe). In an embodiment, the sacrificial layers 16 may have a higher germanium content than the sacrificial layers 18. In an embodiment, the sacrificial layers 16 may have a higher germanium content than the sacrificial layers 14. In an embodiment, the sacrificial layers 16 may have a higher germanium content than the sacrificial layers 14 and a higher germanium content than the sacrificial layers 18. In an embodiment, the sacrificial layers 14 may have approximately the same germanium content as the sacrificial layer 18. In an embodiment, the sacrificial layers 16 may have a germanium content of about fifty percent (50%) and the sacrificial layers 14 and 18 may have a germanium content of about twenty-five percent (25%).

Figure 2:
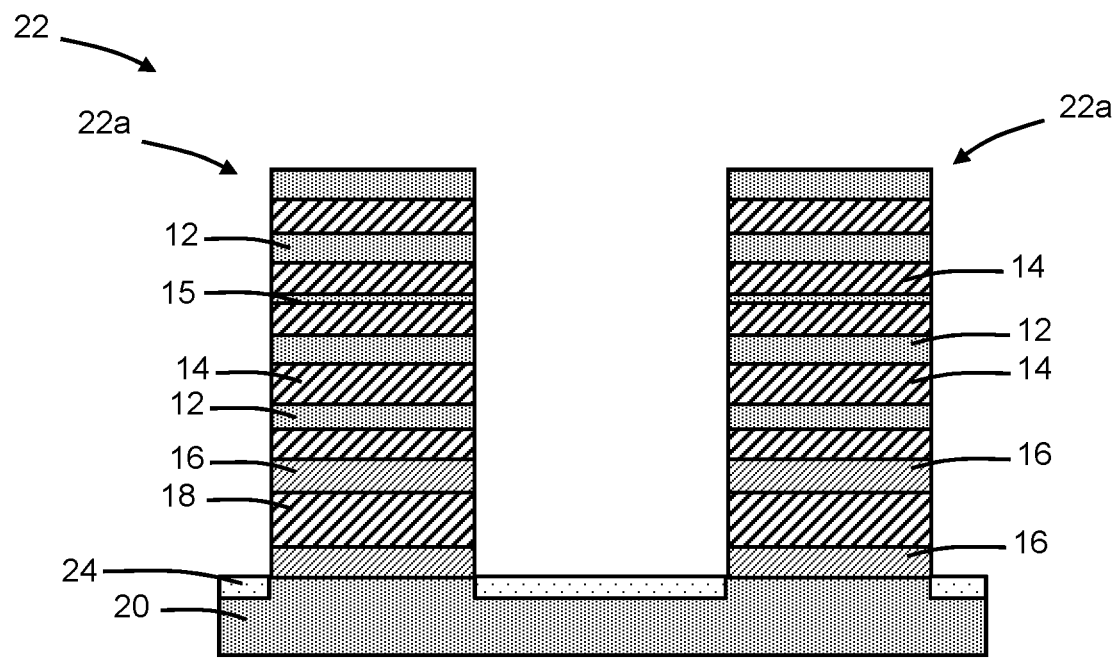
FIG. 2 is a cross-sectional view of the device structure taken generally along line 2-2 in FIG. 2A.
Figure 2A:
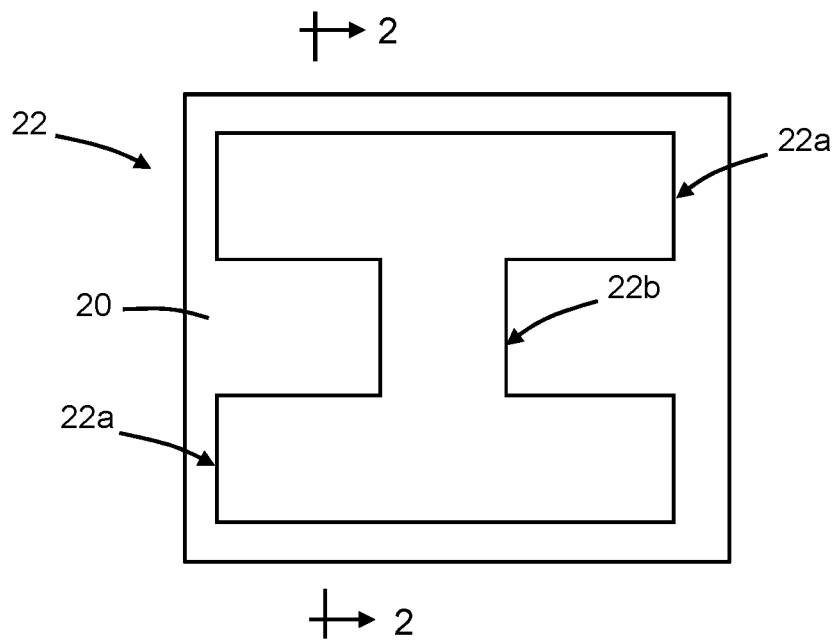
FIG. 2A is a top view of the device structure of FIG. 2.
Figure 3:
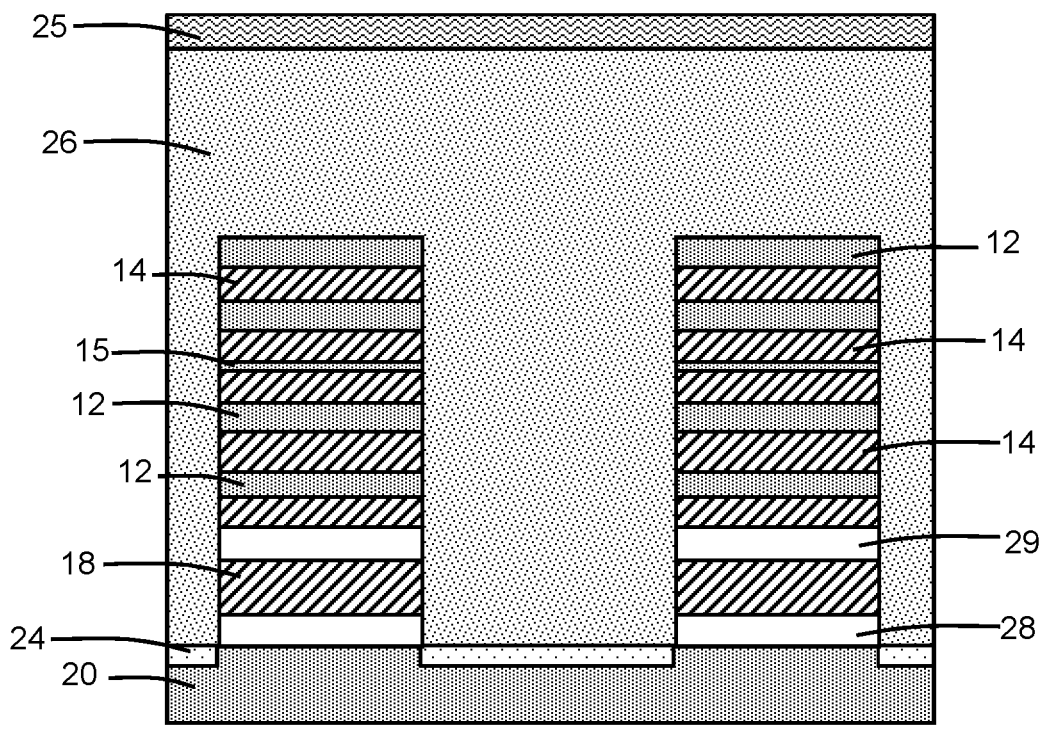
FIG. 3 is a cross-sectional view of the device structure taken generally along line 3-3 in FIG. 3C.
Figure 3A:
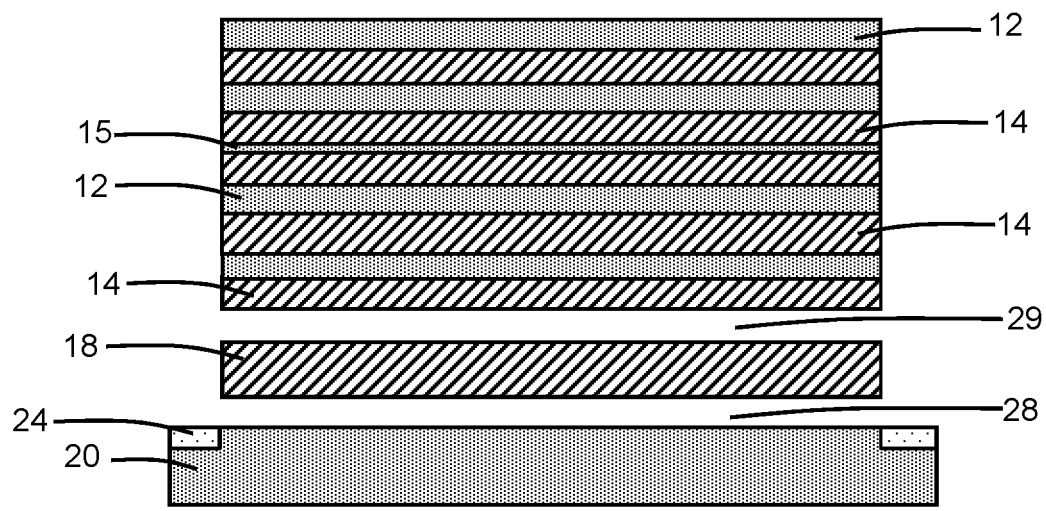
FIG. 3A is a cross-sectional view of the device structure taken generally along line 3A-3A in FIG. 3C.
Figure 3B:
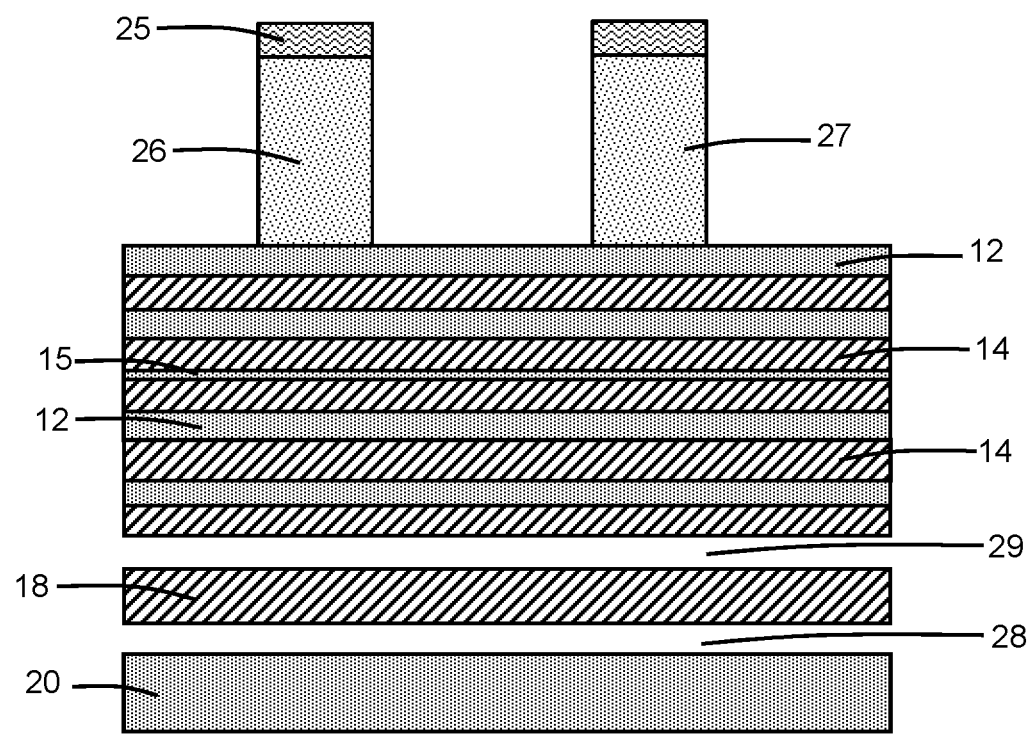
FIG. 3B is a cross-sectional view of the device structure taken generally along line 3B-3B in FIG. 3C.
Figure 3C:
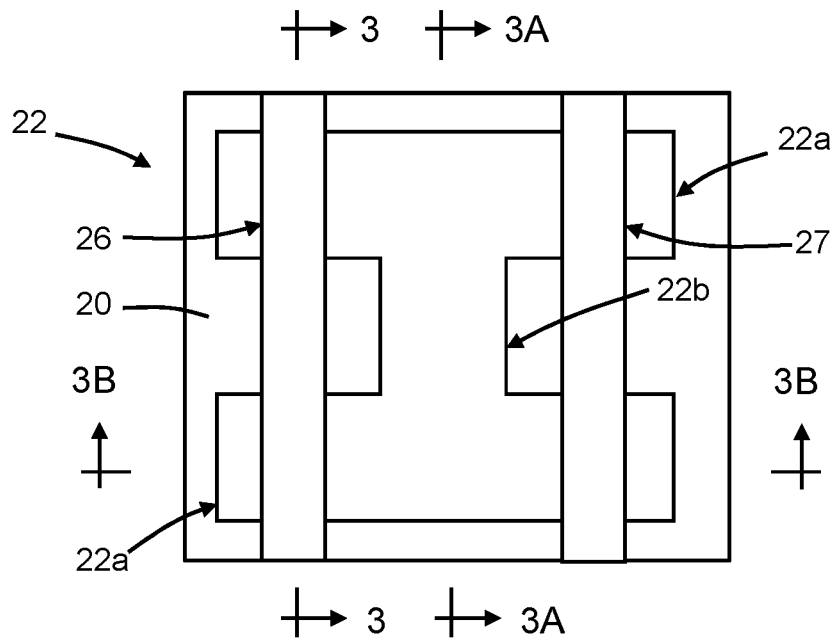
FIG. 3C is a simplified diagrammatic top view of the device structure of FIGS. 3, 3A, 3B.

With reference to FIGS. 2, 2A in which like reference numerals refer to like features in FIG. 1 and at a subsequent fabrication stage of the processing method, the layer stack 10 is patterned with lithography and etching processes to form a body feature 22. The body feature 22 may include a pair of parallel segments 22a that are centrally connected by a transverse segment 22b to provide an H-shape. To that end, an etch mask may be formed by lithography over the layer stack 10. The etch mask may include a layer of, for example, a photoresist that is applied by a spin coating process, pre-baked, exposed to electromagnetic radiation projected through a photomask, baked after exposure, and developed with a chemical developer to define an H-shape masking an area on the top surface of the layer stack 10. An etching process is used to remove the semiconductor materials of the layer stack 10 over unmasked areas exposed by the etch mask.

The etching process also forms shallow trenches that penetrate to a shallow depth into the substrate 20 over the unmasked areas. Shallow trench isolation regions 24 are formed in these shallow trenches in the substrate 20. The shallow trench isolation regions 24 surround the body feature 22. The shallow trench isolation regions 24 may be composed of a dielectric material, such as silicon dioxide, deposited by chemical vapor deposition and etched back with an etching process.

With reference to FIGS. 3, 3A, 3B, 3C in which like reference numerals refer to like features in FIGS. 2, 2A and at a subsequent fabrication stage of the processing method, sacrificial gate structures 26, 27 are formed that cross over the body feature 22 and, in particular, are formed that respectively overlap with the parallel segments 22a of the body feature 22. The transverse segment 22b of the body feature 22 is laterally arranged between the sacrificial gate structures 26, 27. The sacrificial gate structures 26, 27 may include a thin dielectric layer (e.g., a layer of silicon dioxide) formed over the exposed surfaces of the body feature 22 and a semiconductor material, such as amorphous silicon, that is deposited by chemical vapor deposition and patterned with reactive ion etching using a hardmask. The sacrificial gate structures 26, 27 are arranged to cross over the topmost nanosheet channel layer 12 of the body feature 22, to overlap with the sidewalls of its parallel segments 22a, and to also cross over the shallow trench isolation regions 24 between and adjacent to the parallel segments 22a. A dielectric cap 25 is arranged over each of the sacrificial gate structures 26, 27. These dielectric caps 25 may be composed of, for example, silicon nitride, and may be remnants of the hardmask used during patterning.

After forming the sacrificial gate structures 26, 27, the sacrificial layers 16 are removed with an etching process selective to the nanosheet channel layer 12 and the sacrificial layers 14 and 18. The etching process removing the sacrificial layers 16 may be chosen to selectively remove the semiconductor material of the sacrificial layers 16 as a consequence of their elevated germanium content. The sacrificial layers 14 and 18 are not removed, at least in part, due to their lower germanium content, and the nanosheet channel layer 12 is not removed, at least in part, due to the absence of a germanium content. The removal of the sacrificial layers 16 forms cavities 28, 29 at the base of the body feature 22 that are open at the sides of the body feature 22. The sacrificial gate structures 26, 27 provide bridges that support the layer stack 10 following the removal of the sacrificial layers 16. The cavity 28 is arranged in a vertical direction between the substrate 20 and the sacrificial layer 18, and the cavity 29 is arranged in a vertical direction between the bottommost sacrificial layer 14 and the sacrificial layer 18.

Figure 4:
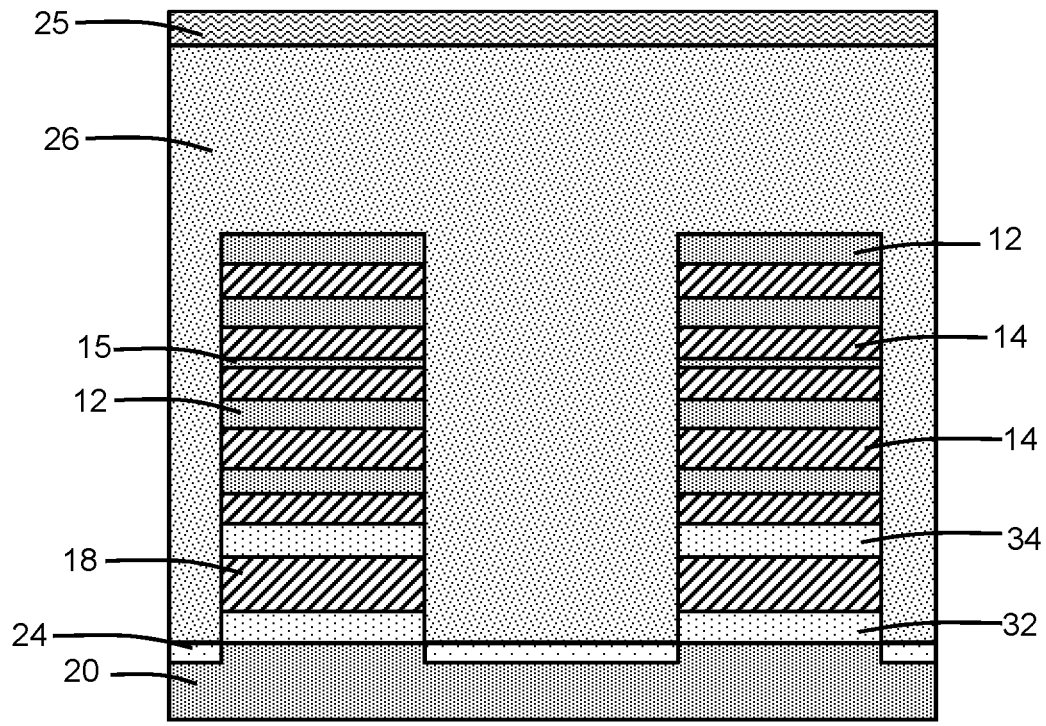
FIGS. 4-15 are cross-sectional views of the device structure of FIG. 3 at successive fabrication stages subsequent to the fabrication stage of FIG. 3.
Figure 4A:
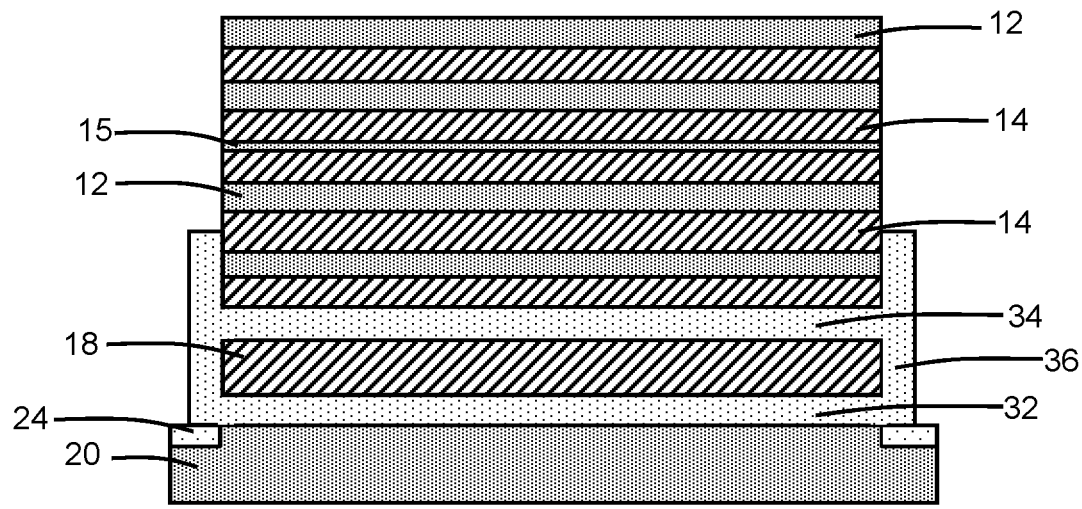
Figure 4B:
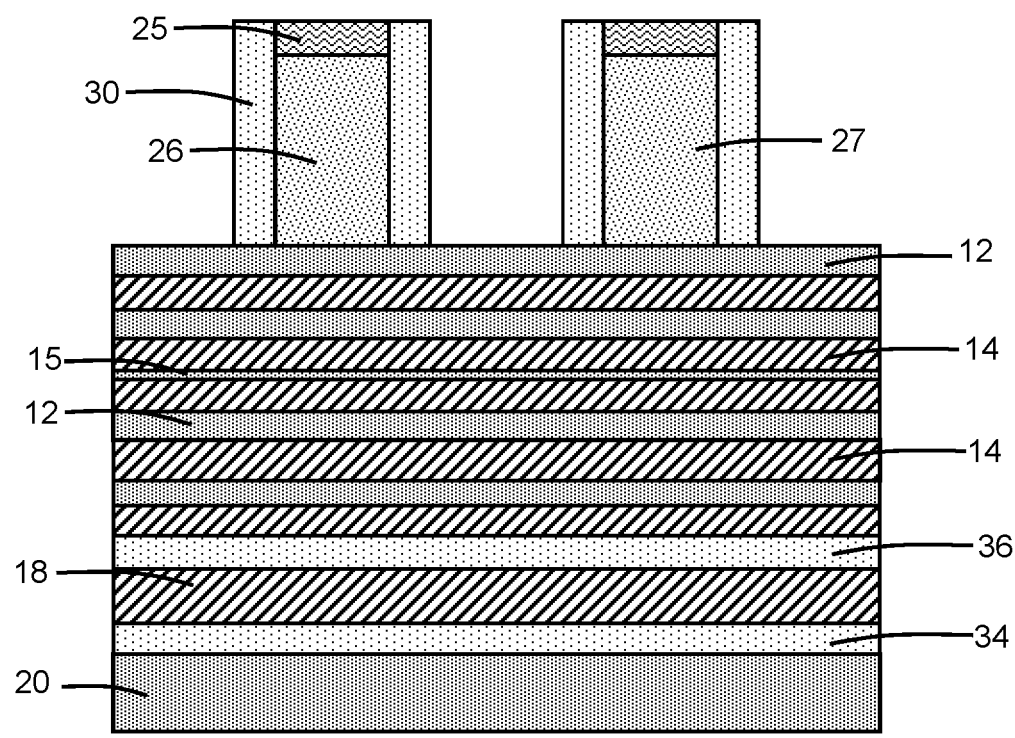

With reference to FIGS. 4, 4A, 4B in which like reference numerals refer to like features in FIGS. 3, 3A, 3B, 3C and at a subsequent fabrication stage of the processing method, sidewall spacers 30 are formed on the top surface of the topmost nanosheet channel layer 12 of the layer stack 10 and are positioned adjacent to the sidewalls of each of the sacrificial gate structures 26, 27 and its dielectric cap 25. The sidewall spacers 30 may be composed of a low-k dielectric material that is conformally deposited, such as SiOCN conformally deposited by atomic layer deposition, and then etched with an anisotropic etching process, such as reactive ion etching.

The conformally-deposited dielectric material is also deposited inside the cavities 28, 29 (FIGS. 3, 3A, 3B) as dielectric layers 32, 34 and on the sidewalls of the body feature 22 as dielectric layer 36. The etching process forming the sidewall spacers 30 also recesses the dielectric layer 36 to a height that is taller, relative to the top surface of the substrate 20 and shallow trench isolation regions 24, than the location of the uppermost cavity 29 now filled by the dielectric layer 34. The dielectric layers 32, 34, 36 and the sacrificial gate structures 26, 27 surround and encapsulate the sacrificial layer 18, and the dielectric layer 32 also provides electrical isolation in the final device structure relative to the substrate 20. In particular, the recessed dielectric layer 36 covers the sacrificial layer 18 at the sidewalls of the body feature 22 that are not covered by the sacrificial gate structures 26, 27, and the dielectric layer 34 is arranged over the sacrificial layer 18.

With reference to FIGS. 5, 5A, 5B, 5C in which like reference numerals refer to like features in FIGS. 4, 4A, 4B and at a subsequent fabrication stage of the processing method, fins 37, 38, 39, 40 are formed by removing the segment 22b of the body feature 22 and portions of the segments 22a of the body feature 22 with an etching process that recesses the body feature 22 is selective to the dielectric layers 32, 34, 36. The etching process recessing the body feature 22 may be selected to selectively remove the semiconductor materials of the nanosheet channel layers 12 and sacrificial layers 14 relative to the dielectric material of the dielectric layers 32, 34, 36. The sacrificial gate structures 26, 27 and sidewall spacers 30 function to self-align the etching process.

The dielectric layers 34, 36 are exposed over the area from which the segment 22b of the body feature 22 is removed. The dielectric material of the dielectric layers 34, 36 may function as an etch stop during the etching process. The sacrificial layer 18 is protected and preserved by the encapsulating dielectric layers 32, 34, 36 and sacrificial gate structures 26, 27 against removal by the etching process to which it would otherwise be susceptible to removal. Following the patterning of the body feature 22, the encapsulated sacrificial layer 18 extends beneath all of the fins 37, 38, 39, 40.

The fins 37, 38, 39, 40 are disconnected from each other and spaced apart from each other. The fins 37 and 38 are overlapped by the sacrificial gate structure 26 and its sidewall spacers 30. The fins 39 and 40 are overlapped by the sacrificial gate structure 27 and its sidewall spacers 30. The fins 38 and 40 may be subsequently used to form complementary field-effect transistors in which the field-effect transistors of opposite conductivity types are stacked and that may be used as a compact combination of pull-up and pull-down transistors in an SRAM bitcell. The fins 37 and 39 may be subsequently used to form nanosheet field-effect transistors that may be used as pass-gate or access transistors in an SRAM bitcell.

After forming the fins 37, 38, 39, 40, inner spacers 42 are formed inside indents defined in the sidewalls of the fins 37, 38, 39, 40. To that end, the sacrificial layers 14 are laterally recessed relative to the nanosheet channel layers 12 with an isotropic etching process that etches the material constituting the sacrificial layers 14 selective to the material constituting the nanosheet channel layers 12. Because the nanosheet channel layers 12 are not laterally recessed by the etching process, the lateral recessing of the sacrificial layers 14 generates the indents in the sidewalls of each of the fins 37, 38, 39, 40. The inner spacers 42 may be formed by depositing a conformal layer composed of a dielectric material, such as silicon nitride deposited by atomic layer deposition, that fills the indents by pinch-off, and then performing an etching process that removes the conformal layer outside of the indents.

Figure 5:
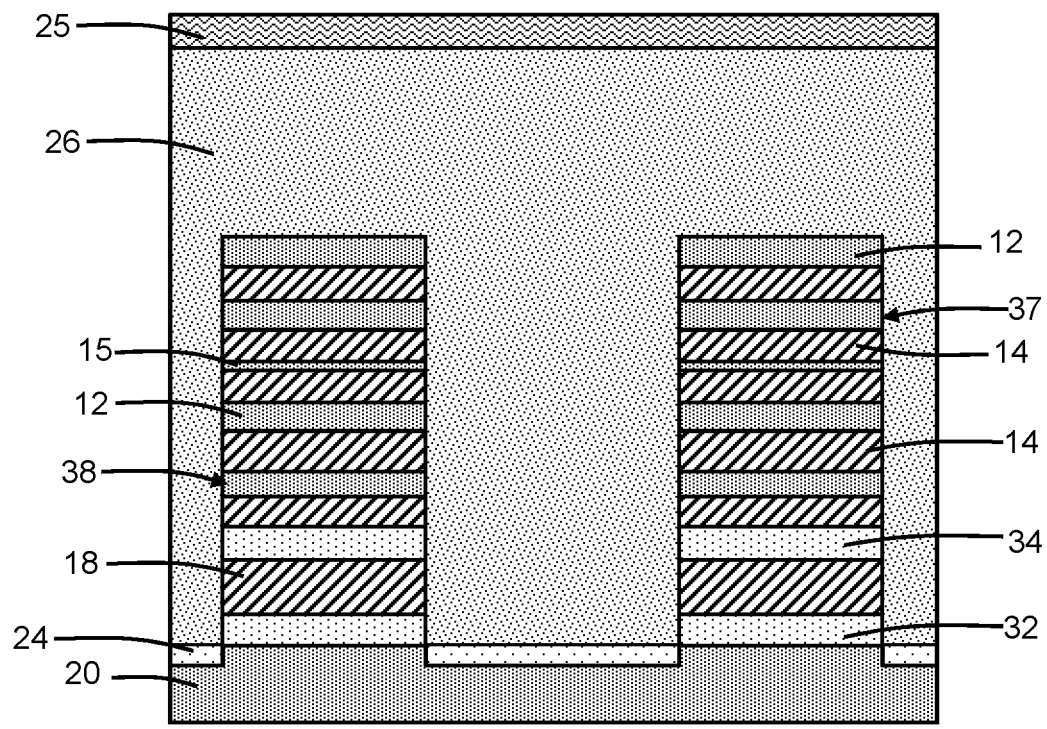
Figure 5A:
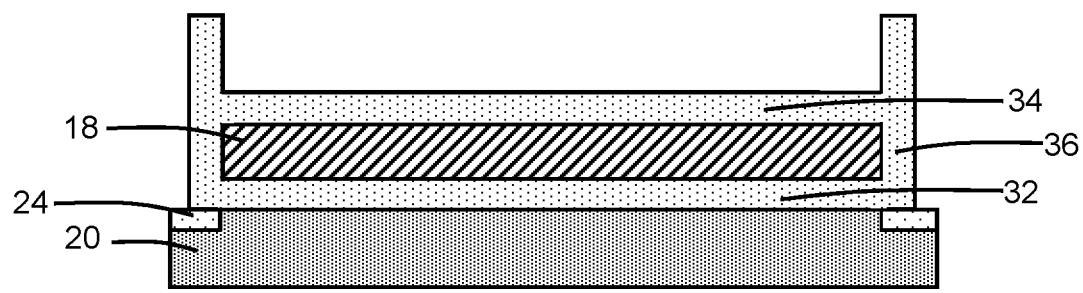
FIG. 5A is taken generally along line 5A-5A.
Figure 5B:
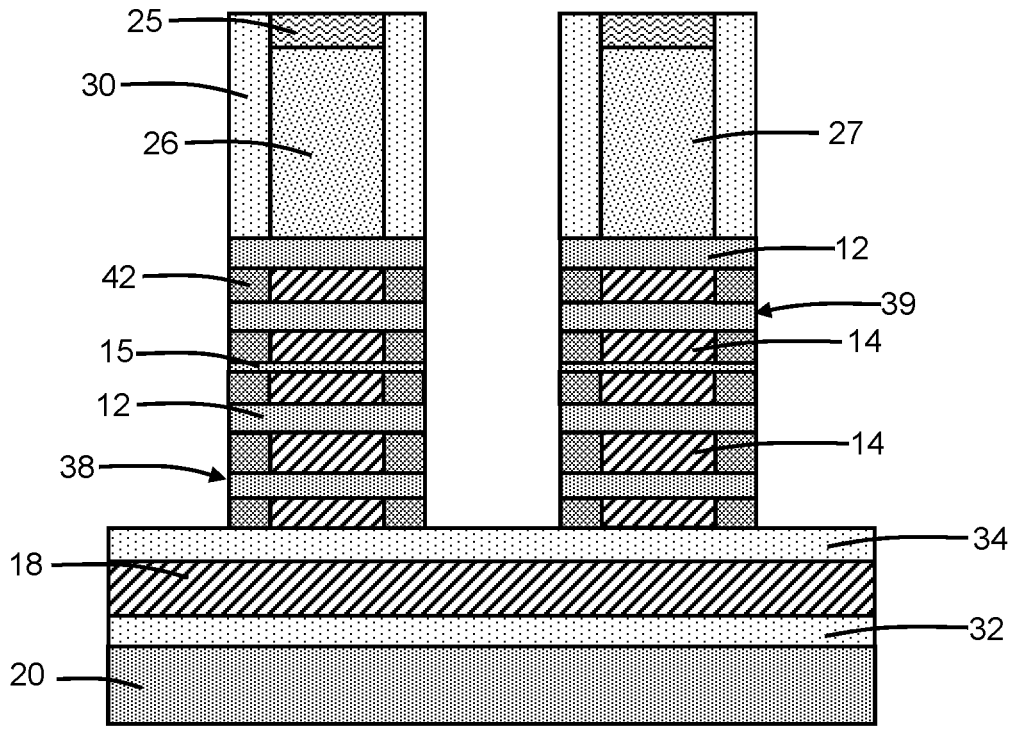
FIG. 5B is taken generally along line 5B-5B.
Figure 5C:
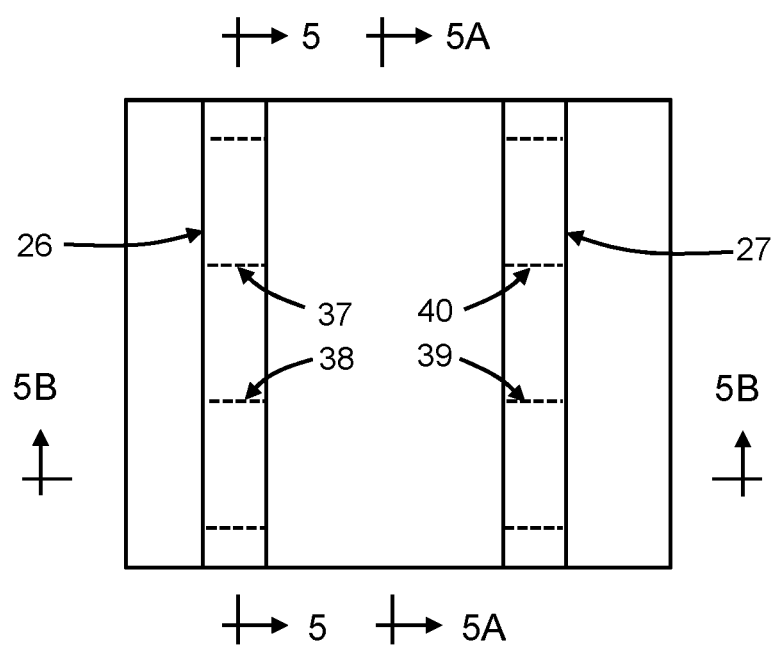
Figure 6:
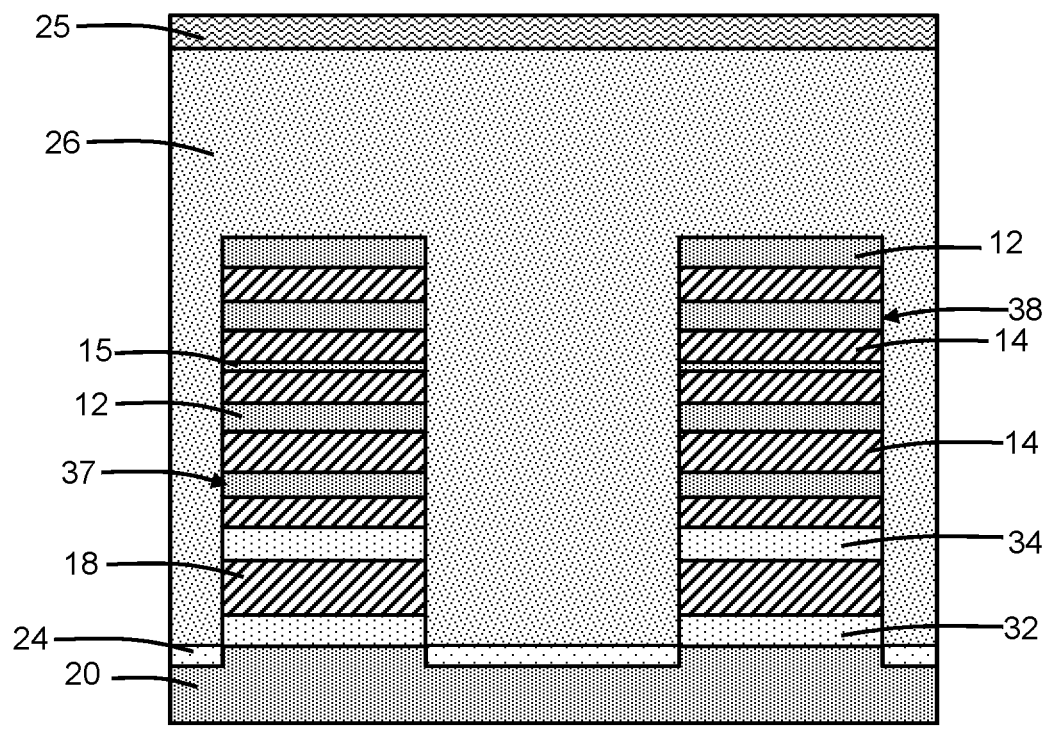
Figure 6A:
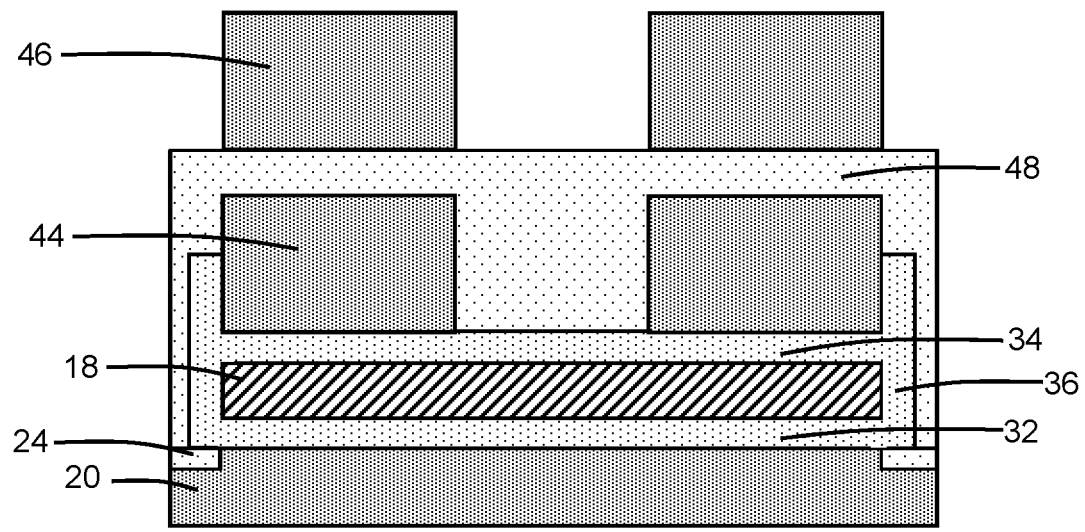
Figure 6B:
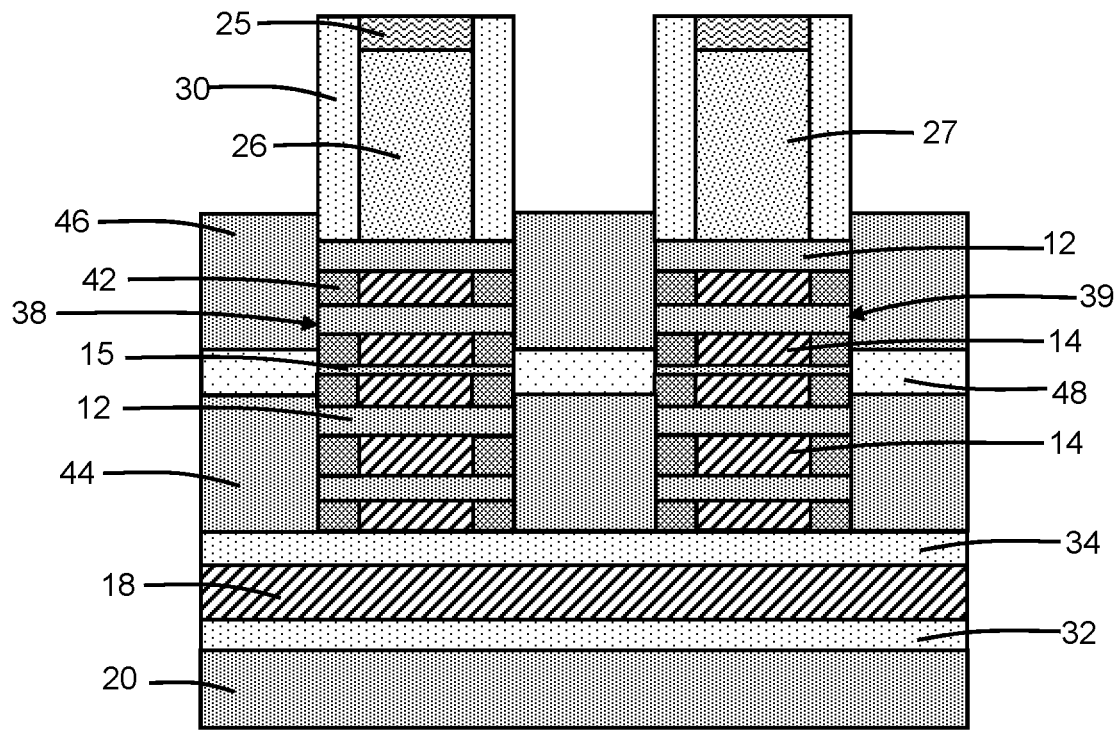

With reference to FIGS. 6, 6A, 6B in which like reference numerals refer to like features in FIGS. 5, 5A, 5B and at a subsequent fabrication stage of the processing method, source/drain regions 44 and source/drain regions 46 are formed adjacent to the opposite sidewalls of the fins 37, 38, 39, 40. As used herein, the term "source/drain region" means a doped region of semiconductor material that can function as either a source or a drain of a nanosheet field-effect transistor. The source/drain regions 44 are physically coupled with the nanosheet channel layers 12 in a lower portion of the fins 37, 38, 39, 40, and the source/drain regions 46 are physically coupled with the nanosheet channel layers 12 in an upper portion of the fins 37, 38, 39, 40. The source/drain regions 44 and the source/drain regions 46 are physically isolated from the sacrificial layers 14 by the inner spacers 42, and the source/drain regions 44 are electrically isolated from the substrate 20 by the layers 32, 34, 36. The source/drain regions 44, 46 associated with and shared by the fins 38, 39 are spaced laterally from the source/drain regions 44, 46 associated with and shared by fins 37, 40. Unshared source/drain regions 44, 46 are arranged outside of the spaces between the fins 38, 39 and the fins 37, 39.

The source/drain regions 44 may be formed by an epitaxial growth process in which semiconductor material grows from growth seeds provided by both of the side surfaces of the nanosheet channel layers 12 exposed at the opposite sidewalls of the fins 37, 38, 39, 40. In the space between the fins 37 and 40, the epitaxially-grown semiconductor material merges to form one of the source/drain regions 44. In the space between the fins 38 and 39, the epitaxially-grown semiconductor material merges to form another of the source/drain regions 44. The semiconductor material constituting the source/drain regions 44 may be heavily doped during epitaxial growth with an n-type dopant (e.g., phosphorus and/or arsenic) that provides n-type electrical conductivity.

After the source/drain regions 44 are formed, a dielectric layer 48 composed of a dielectric material, such as silicon dioxide, is formed over the source/drain regions 44 and in the space around the fins 37, 38, 39, 40. After forming the dielectric layer 48, the source/drain regions 46 may be formed by an epitaxial growth process in which semiconductor material grows from growth seeds provided by the side surfaces of the topmost nanosheet channel layers 12 exposed at the opposite sidewalls of the fins 37, 38, 39, 40 and above the dielectric layer 48. In the space between the fins 37 and 40, the epitaxially-grown semiconductor material merges to form one of the source/drain regions 46. In the space between the fins 38 and 39, the epitaxially-grown semiconductor material merges to form another of the source/drain regions 46. The semiconductor material constituting the source/drain regions 46 may be heavily doped to have an electrical polarity or conductivity that is opposite to the electrical polarity or conductivity of the source/drain regions 44. In an embodiment in which the source/drain regions 44 have n-type conductivity, the semiconductor material constituting the source/drain regions 46 may be doped during epitaxial growth with a p-type dopant (e.g., boron) that provides p-type electrical conductivity.

The upper source/drain regions 46 are physically separated and electrically isolated from the lower source/drain regions 44 of opposite conductivity-type semiconductor material by the dielectric layer 48. The stacked source/drain regions 44, 46 in the spaces between the fins 38, 39 and between the fins 37, 40 may be used to form complementary field-effect transistors.

Figure 7:
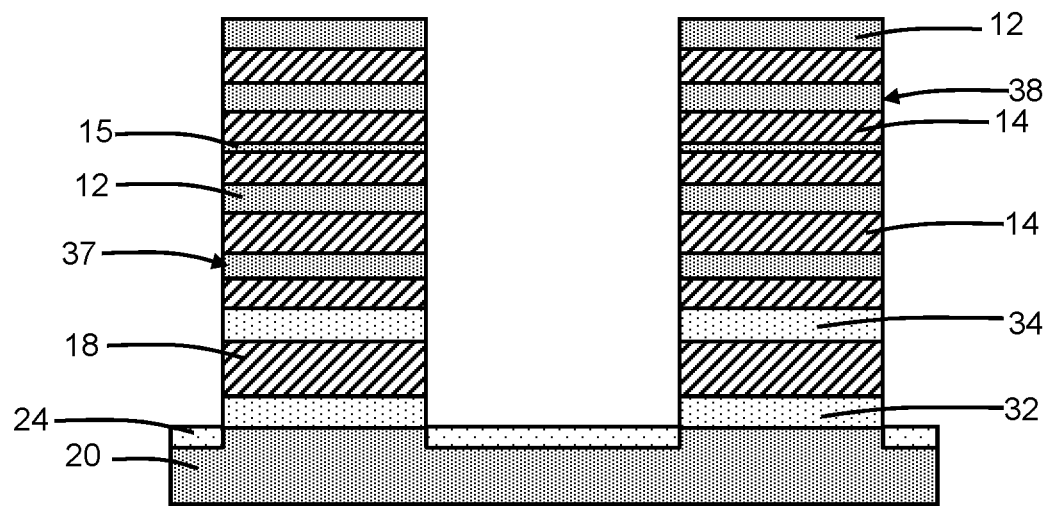
Figure 7A:
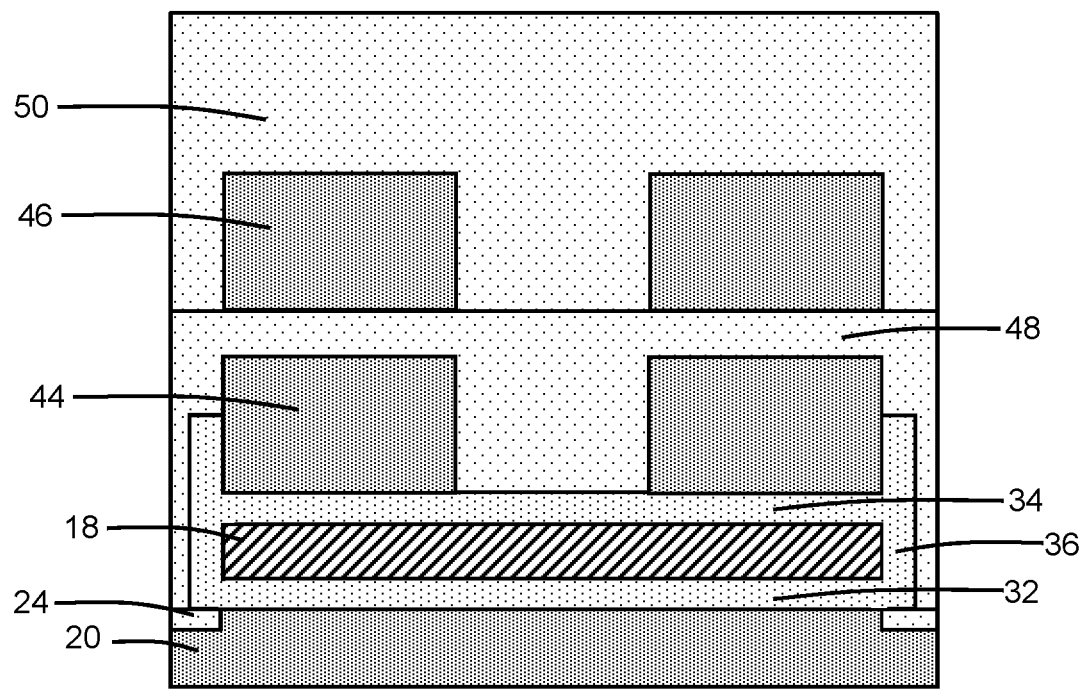
Figure 7B:
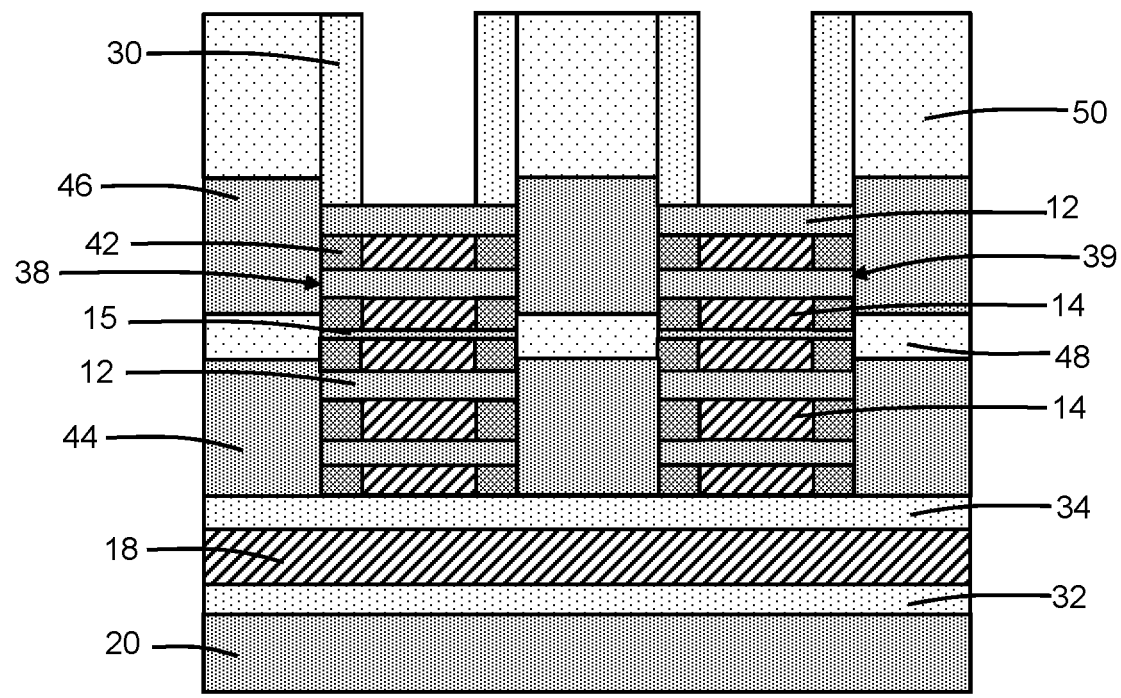

With reference to FIGS. 7, 7A, 7B in which like reference numerals refer to like features in FIGS. 6, 6A, 6B and at a subsequent fabrication stage of the processing method, an interlayer dielectric layer 50 is deposited over the sacrificial gate structures 26, 27, the sidewall spacers 30, the fins 37, 38, 39, 40, and the source/drain regions 44, 46, and planarized using chemical-mechanical polishing. The planarization removes the dielectric caps 25 from the sacrificial gate structures 26, 27 and thereby reveals the sacrificial gate structures 26, 27 at the planarized top surface.

The sacrificial gate structures 26, 27 are subsequently removed with one or more etching processes selective to the materials of the nanosheet channel layers 12, the shallow trench isolation regions 24, the inner spacers 42, and the interlayer dielectric layer 50. The removal of the sacrificial gate structures 26, 27 exposes respective side surfaces of the sacrificial layer 18 at the sidewalls of the fins 37, 38, 39, 40 that are not covered by the dielectric layer 36. However, the sacrificial layers 14 are not removed at this juncture of the process flow.

Figure 8:
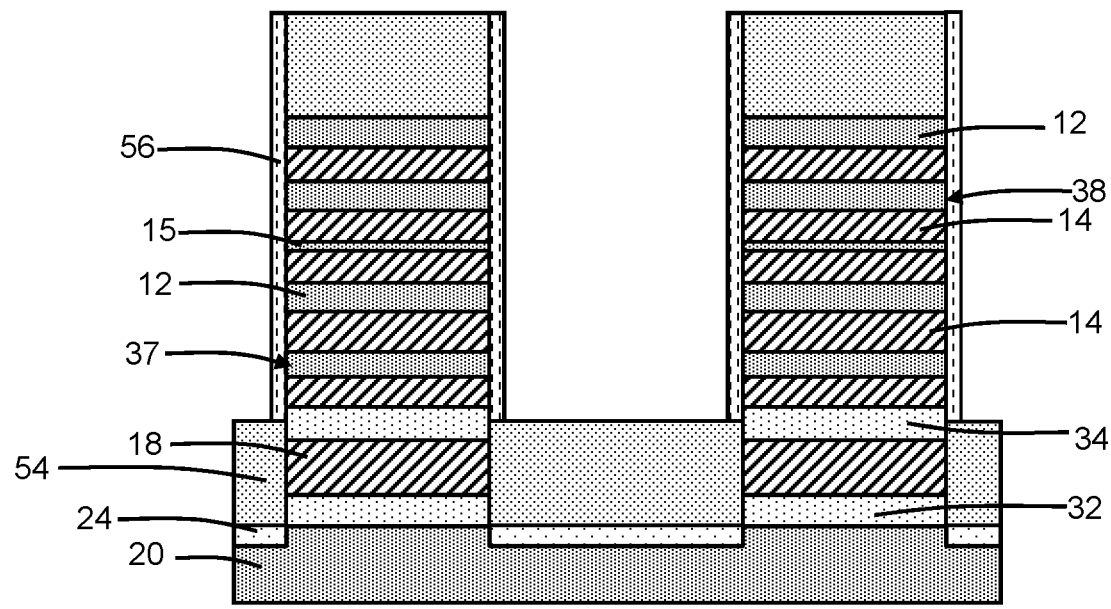
Figure 8A:
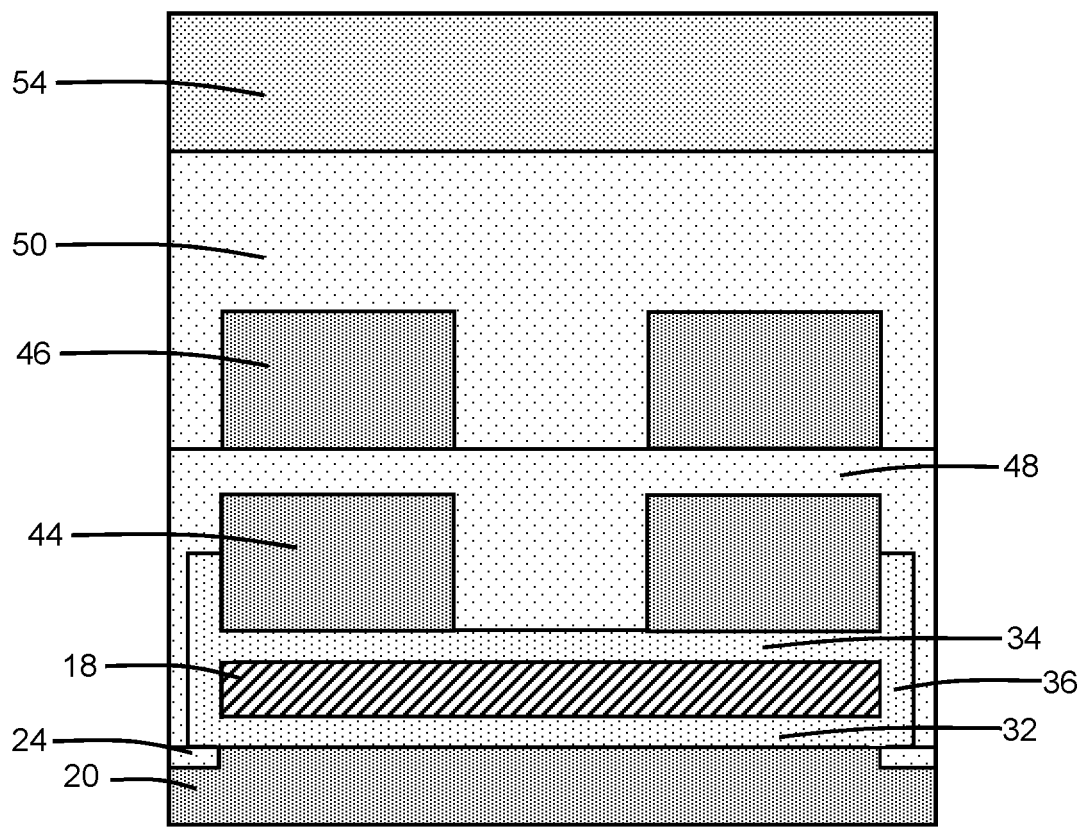
Figure 8B:
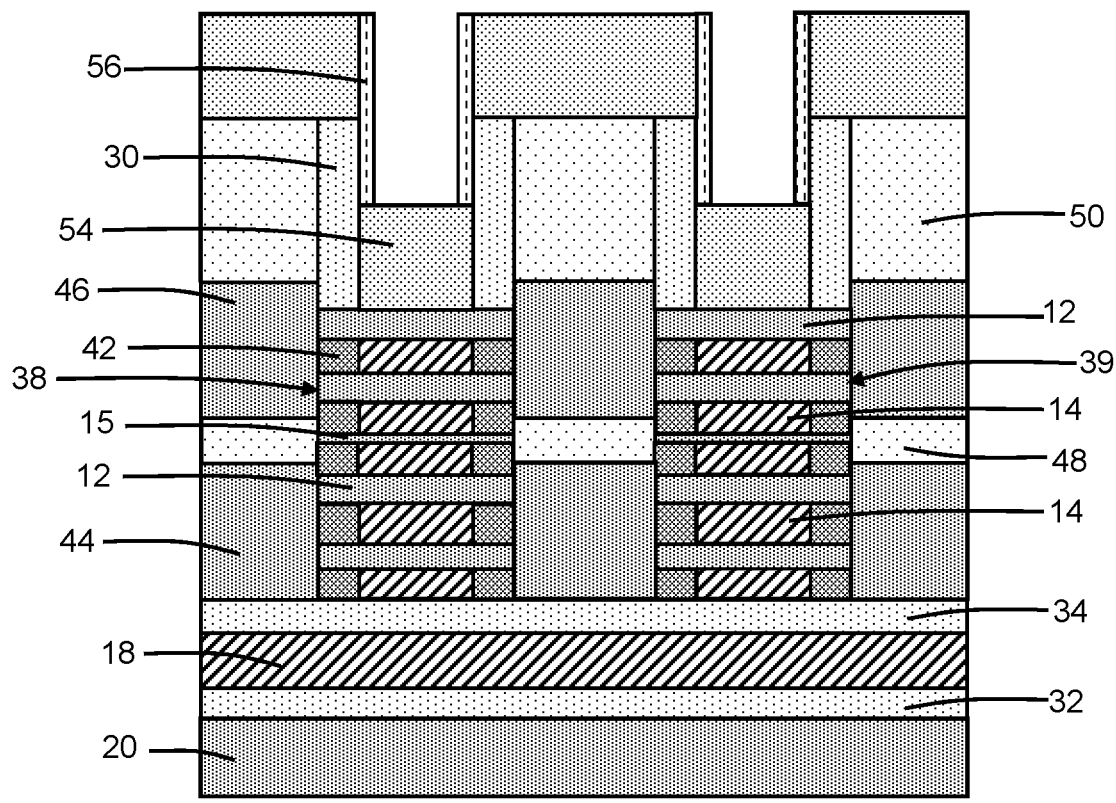

With reference to FIGS. 8, 8A, 8B in which like reference numerals refer to like features in FIGS. 7, 7A, 7B and at a subsequent fabrication stage of the processing method, a dielectric layer 54 is deposited with a thickness sufficient to cover the exposed side surfaces of the sacrificial layer 18 at the sidewalls of the fins 37, 38, 39, 40 by the removal of the sacrificial gate structures 26, 27. The dielectric layer 54 may be deposited by a conformal or directional deposition process such that the dielectric material does not deposit on the sidewalls of the fins 37, 38, 39, 40. The dielectric layer 54 may be composed of silicon nitride, and the dielectric layer 54 has a thickness sufficient to overlap with the upper dielectric layer 34.

Sidewall spacers 56 are formed on the top surface of the dielectric layer 54 and are positioned adjacent to the sidewalls of each of the fins 37, 38, 39, 40. The sidewall spacers 56 may be composed of a low-k dielectric material, such as SiC, that is conformally deposited by, for example, atomic layer deposition and then etched with an anisotropic etching process, such as reactive ion etching. The sidewall spacers 56 cover and mask underlying portions of the dielectric layer 54.

Figure 9:
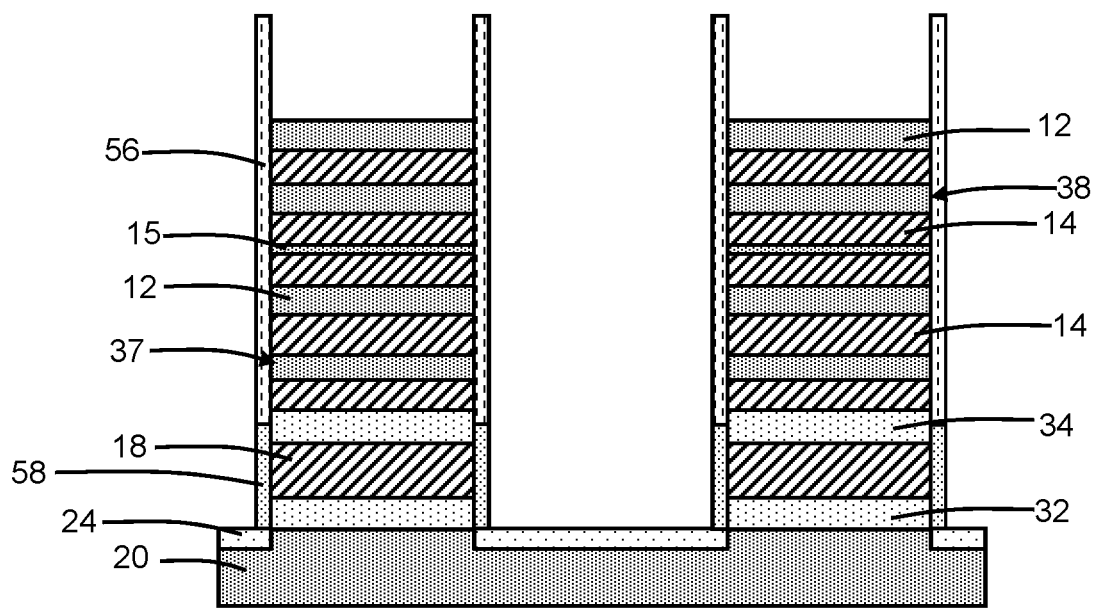
Figure 9A:
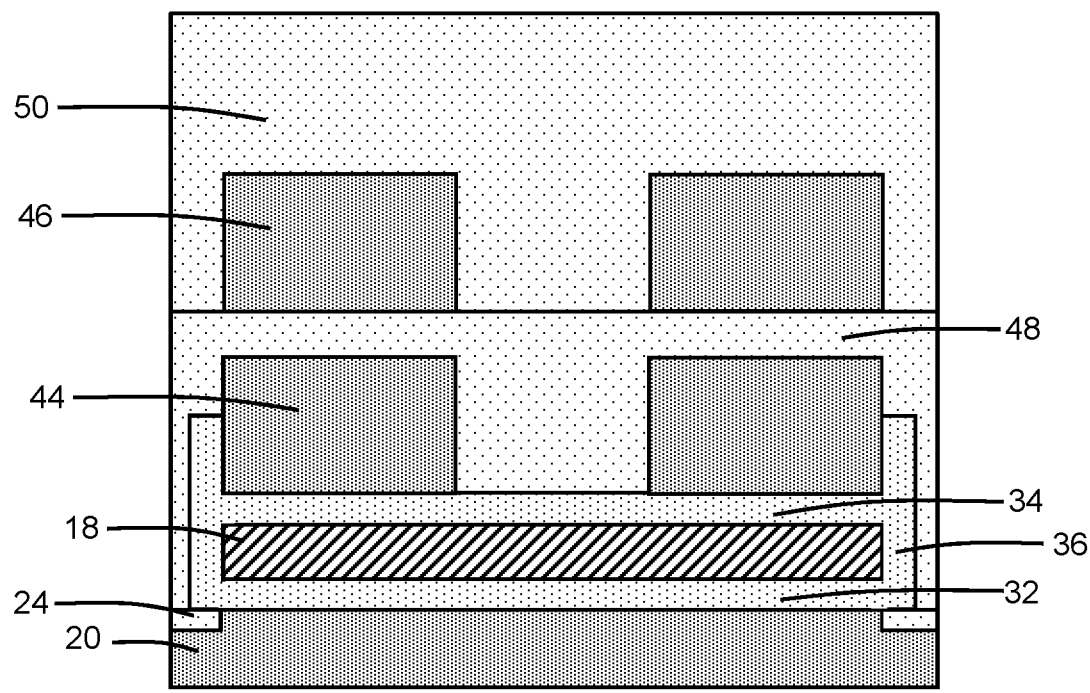
Figure 9B:
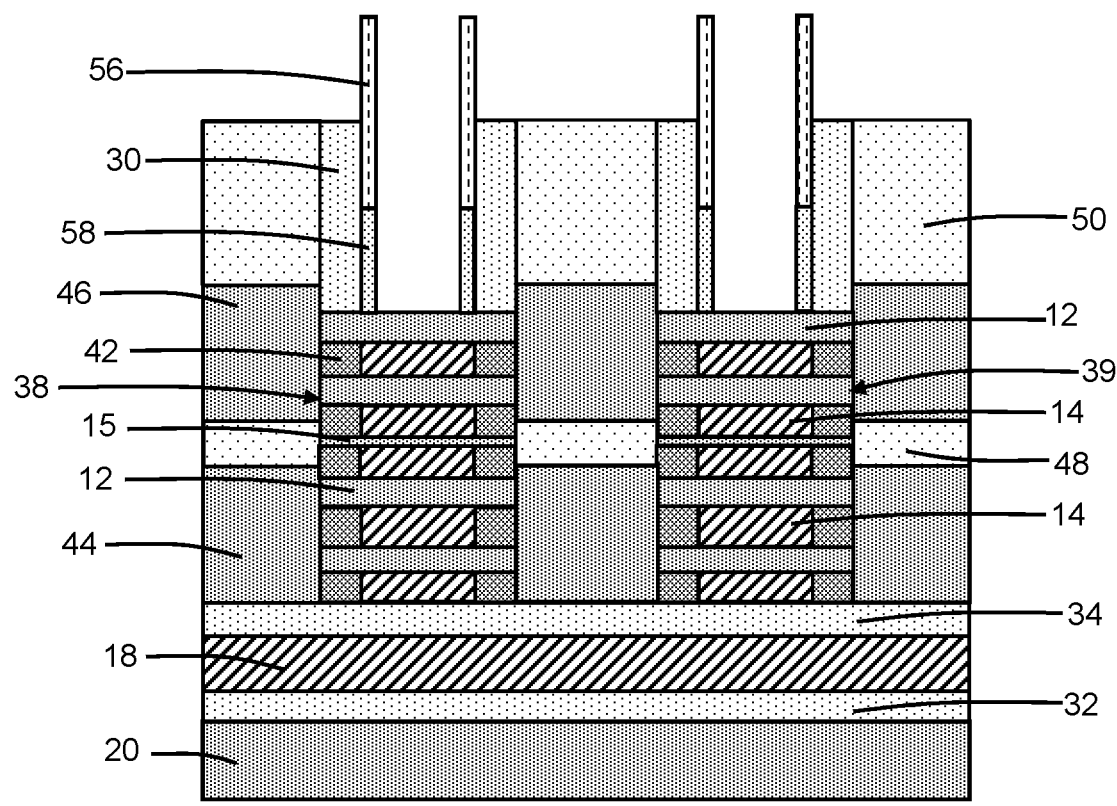

With reference to FIGS. 9, 9A, 9B in which like reference numerals refer to like features in FIGS. 8, 8A, 8B and at a subsequent fabrication stage of the processing method, sidewall spacers 58 are formed by etching the dielectric layer 54 with an anisotropic etching process, such as reactive ion etching. The sidewall spacers 56 provide a hardmask covering underlying portions of the dielectric layer 54 during the etching process and, following the etching process, the sidewall spacers 56 are arranged directly over the sidewall spacers 58. Each stacked pair of the sidewall spacers 56 and the sidewall spacers 58 has an interface that is laterally aligned with the topmost dielectric layer 34. The dielectric layers 32, 34, 36 and the sidewall spacers 58 cooperate to fully encapsulate and surround the sacrificial layer 18 beneath the fins 37, 38, 39, 40.

With reference to FIGS. 10, 10A, 10B, 10C in which like reference numerals refer to like features in FIGS. 9, 9A, 9B and at a subsequent fabrication stage of the processing method, an etch mask 60 is applied and patterned to cover the fin 38. The etch mask 60 may include a spin-on hardmask (SOH), such as an organic planarization layer (OPL), that is applied by spin coating and patterned with lithography and etching. The sidewall spacers 58 exposed by the etch mask 60 are removed from the fins 37, 39, and 40 selective to the sidewall spacers 56 and the shallow trench isolation regions 24 with an etching process. The removal of the sidewall spacers 58 re-exposes the side surfaces of the sacrificial layer 18 arranged beneath the fins 37, 39, and 40. The side surfaces of the sacrificial layer 18 arranged beneath the fin 38 are masked by the etch mask 60.

Figure 10:
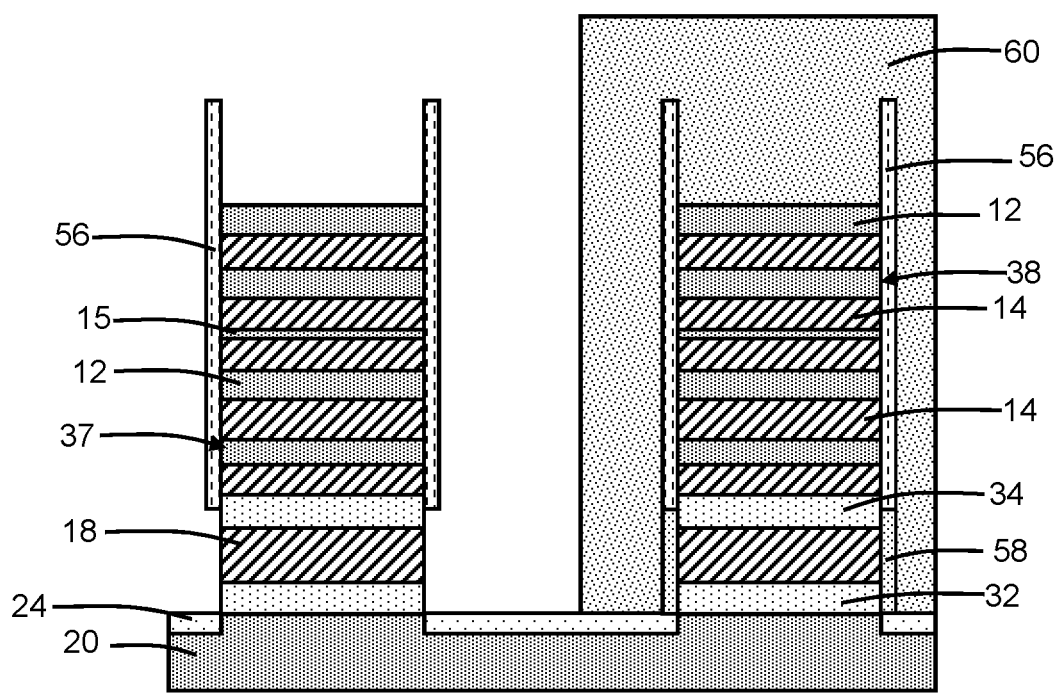
Figure 10A:
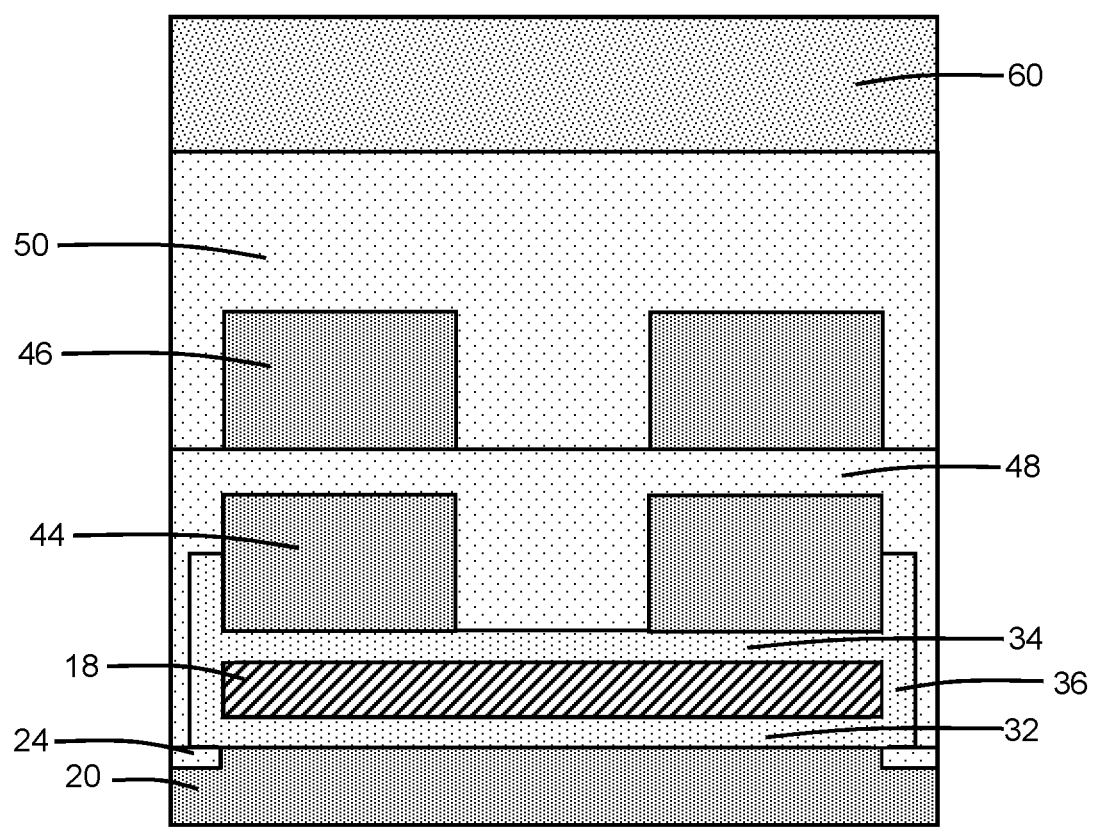
FIG. 10A is taken generally along line 10A-10A.
Figure 10B:
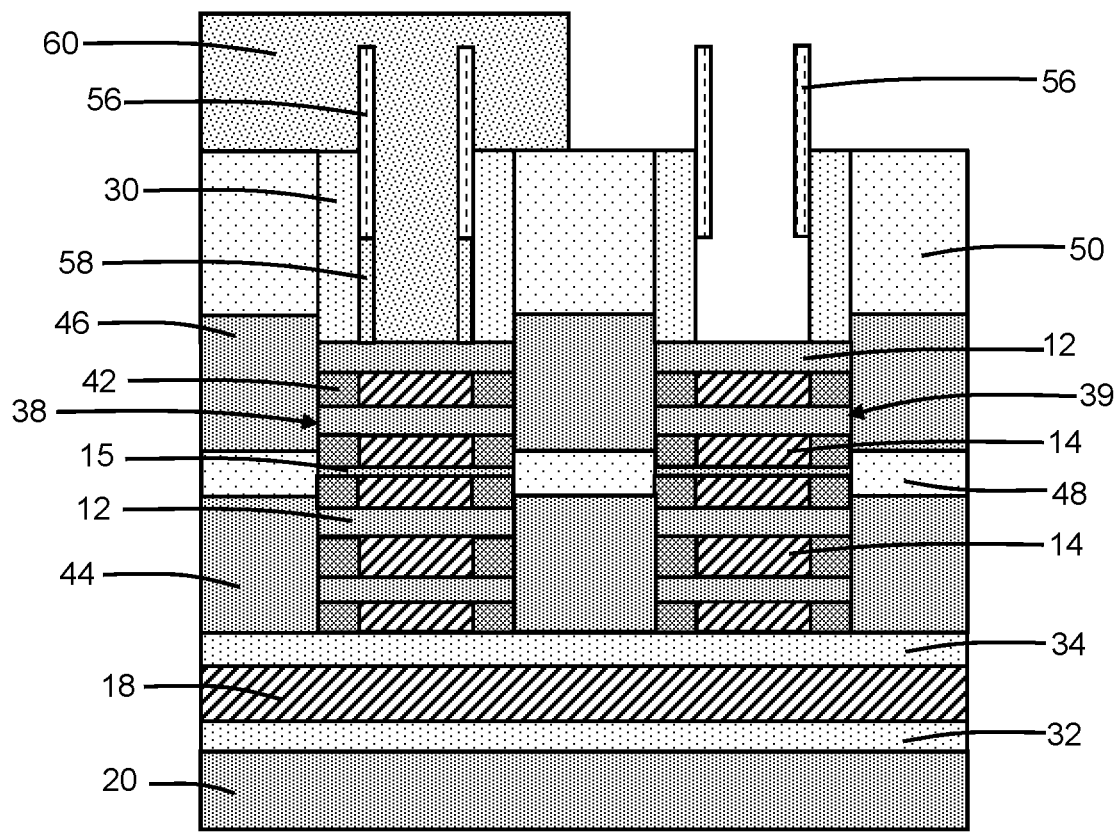
FIG. 10B is taken generally along line 10B-10B.
Figure 10C:
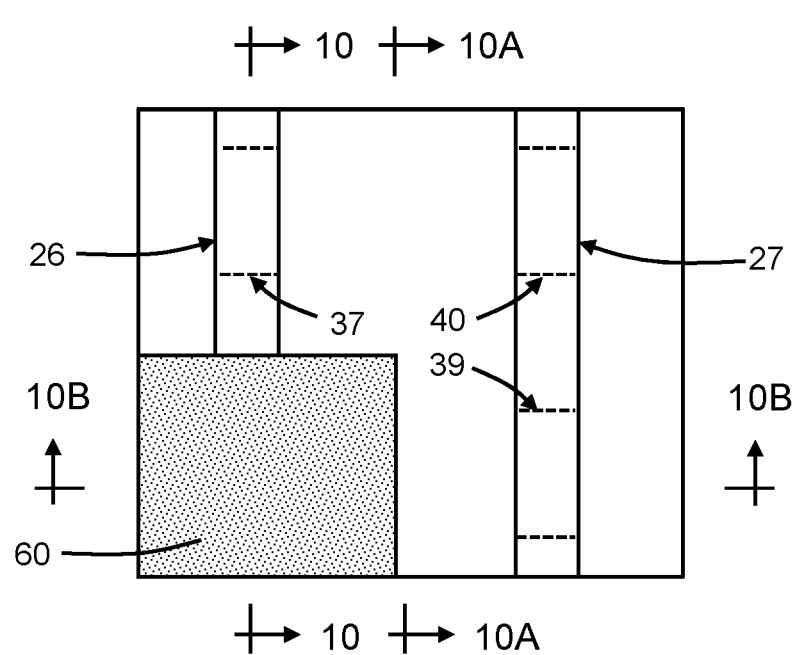
Figure 11:
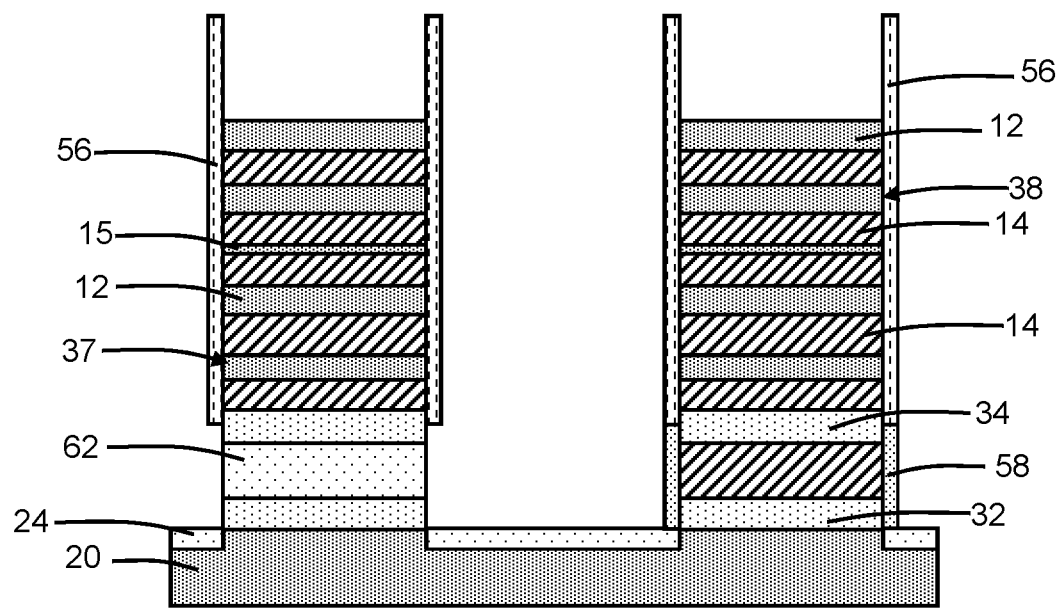
Figure 11A:
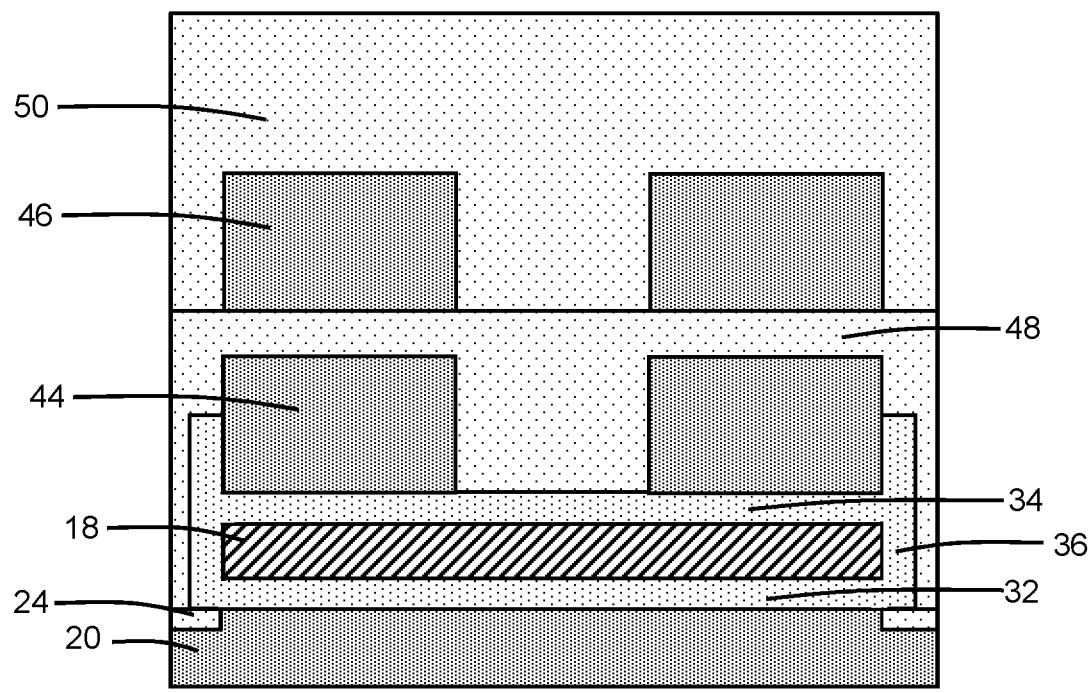
Figure 11B:
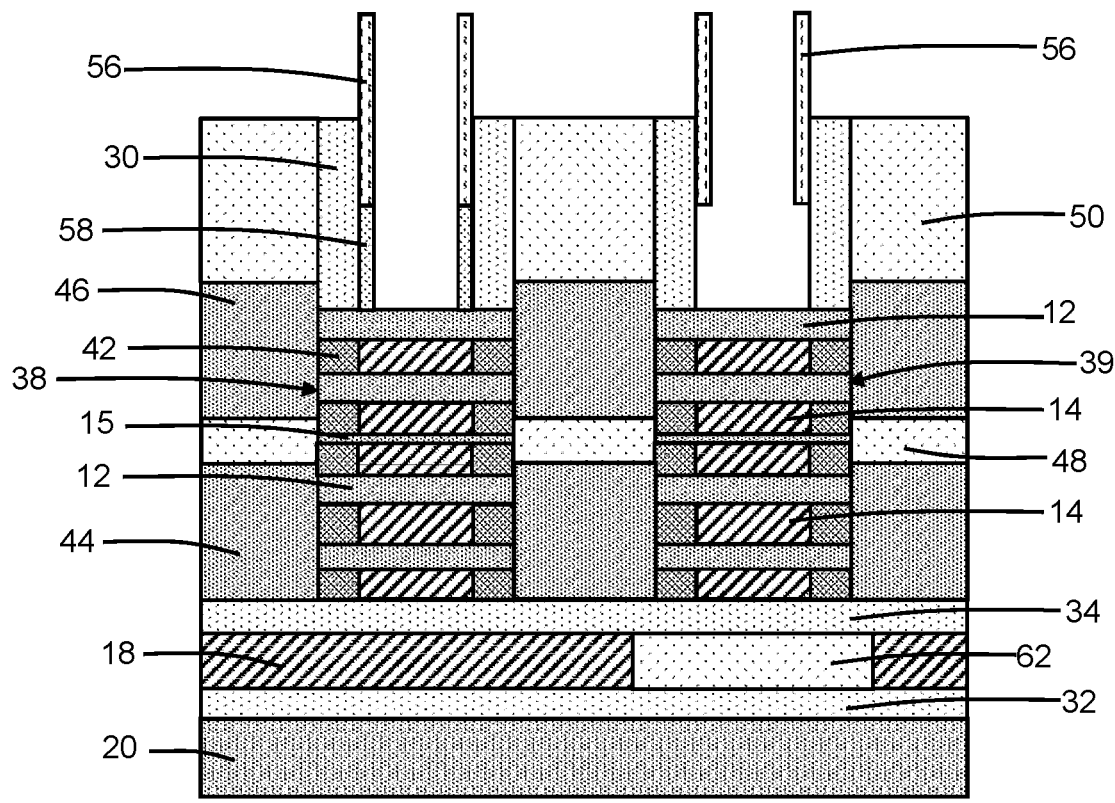

With reference to FIGS. 11, 11A, 11B in which like reference numerals refer to like features in FIGS. 10, 10A, 10B and at a subsequent fabrication stage of the processing method, the etch mask 60 is removed by, for example, ashing with an oxygen plasma. The sacrificial layer 18 beneath the fin 37, the sacrificial layer 18 beneath the fin 39, and the sacrificial layer 18 beneath the fin 40 are converted to a dielectric material in order to form respective dielectric layers 62. In an embodiment, the sacrificial layer 18 beneath the fins 37, 39, and 40 may be converted to an oxide containing silicon and germanium using a selective oxidation process that does not oxidize the exposed topmost nanosheet channel layer 12. In an embodiment, the oxidation process may be performed selectively using a low-temperature plasma-assisted oxidation process using an oxygen plasma stream. The sacrificial layer 18 in other locations, including beneath the fin 38, is protected by the dielectric layers 32, 34, 36 and the sidewall spacers 58, and is not oxidized. The sacrificial layers 14 are covered by the sidewall spacers 56, which prevents oxidation and preserves the sacrificial layers 14 for subsequent removal in a replacement gate process.

With reference to FIGS. 12, 12A, 12B, 12C in which like reference numerals refer to like features in FIGS. 11, 11A, 11B and at a subsequent fabrication stage of the processing method, the sidewall spacers 56 are removed from fin 38, and the sidewall spacers 56 and 58 are removed from fins 37, 39, and 40 with one or more etching processes. A dielectric pillar 68 composed of a dielectric material, such as silicon nitride, is formed in the space over the shallow trench isolation region 24 and between the fin 37 and the fin 38. A similar dielectric pillar 69 is formed in the space over the shallow trench isolation region 24 and between the fin 39 and the fin 40. The dielectric pillars 68, 69 subsequently provide gate cuts. The dielectric pillars 68, 69 may be formed by forming adjacent sections of a sacrificial material, such as epitaxially-grown silicon germanium, that are separated by a slot formed by terminating the formation prior to pinch off, and depositing a dielectric material, such as silicon nitride, that pinches off inside the slot. The sacrificial material is selectively removed by an etching process after the dielectric pillars 68, 69 are formed.

The dielectric pillar 68 is positioned in the space between the fin 37 and the fin 38, and the dielectric pillar 69 is positioned in the space between the fin 39 and the fin 40. The dielectric pillars 68 and 69 are laterally arranged with an alignment in a direction (i.e., the x-direction) within an x-y plane. The alignment of the dielectric pillars 68, 69 is preserved as respective cuts between the gate electrodes of subsequently-formed gate structures associated with the fins 37, 38, 39, 40 following a replacement gate process. The dielectric pillars 68, 69 are formed without any asymmetric offset or shift relative to each other.

The sacrificial layers 14 and the unoxidized remainder of the sacrificial layer 18 are then removed selective to the nanosheet channel layers 12, the inner spacers 42, and the dielectric layers 62 with an etching process, such as vapor phase hydrochloric acid or a gas chemical etch involving chlorine trifluoride (ClF$_3$) gas. The layer 15 is also removed by the etching process. The removal of the sacrificial layer 18 generates a cavity 64 that extends laterally beneath the fin 38 and beneath the source/drain regions 44, 46. The removal of the sacrificial layers 14 releases the associated nanosheet channel layers 12 and generates a cavity 66 that surrounds the nanosheet channel layers 12 of each of the fins 37, 38, 39, and 40. The dielectric layers 62 interrupt the continuity of the cavity 66 and prevent the cavity 66 from forming directly beneath the fins 37, 39, and 40, which isolates the cavities 64 associated with the fins 37, 39, and 40 from the cavity 66.

Figure 12:
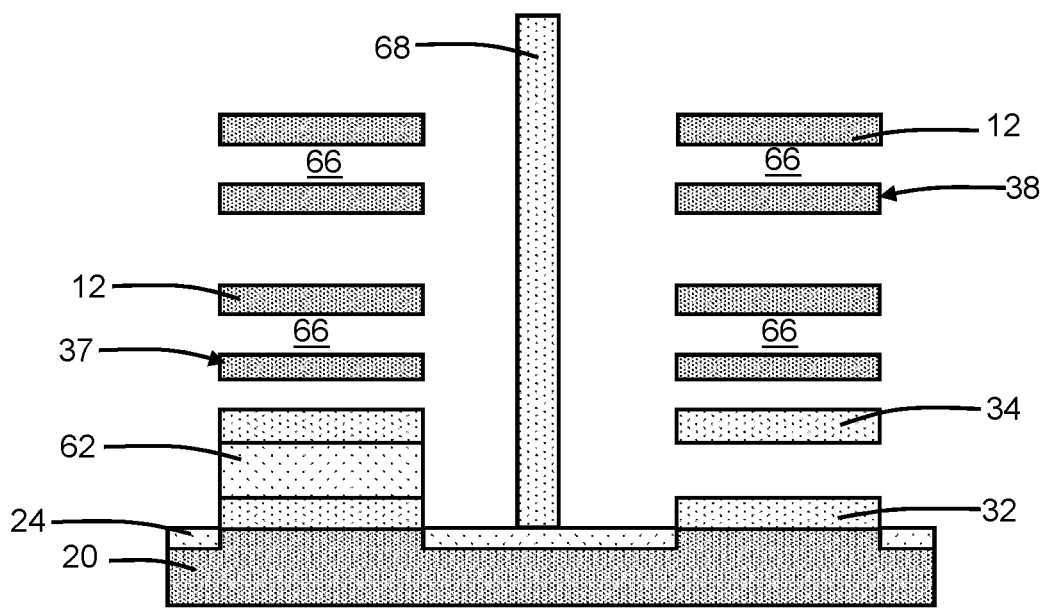
Figure 12A:
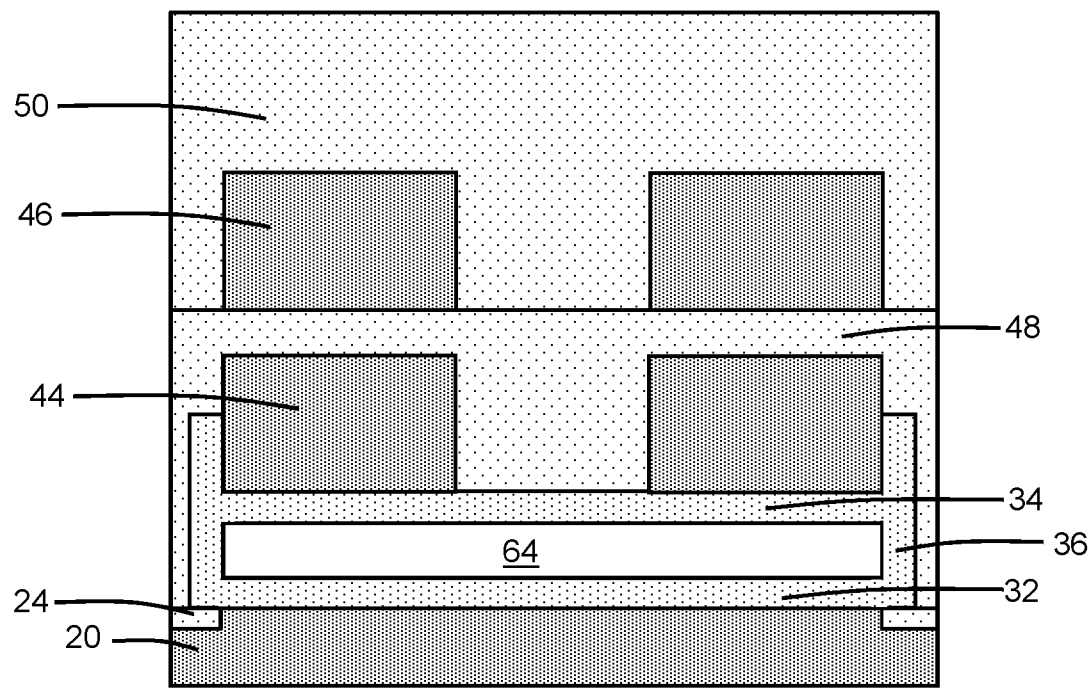
FIG. 12A is taken generally along line 12A-12A.
Figure 12B:
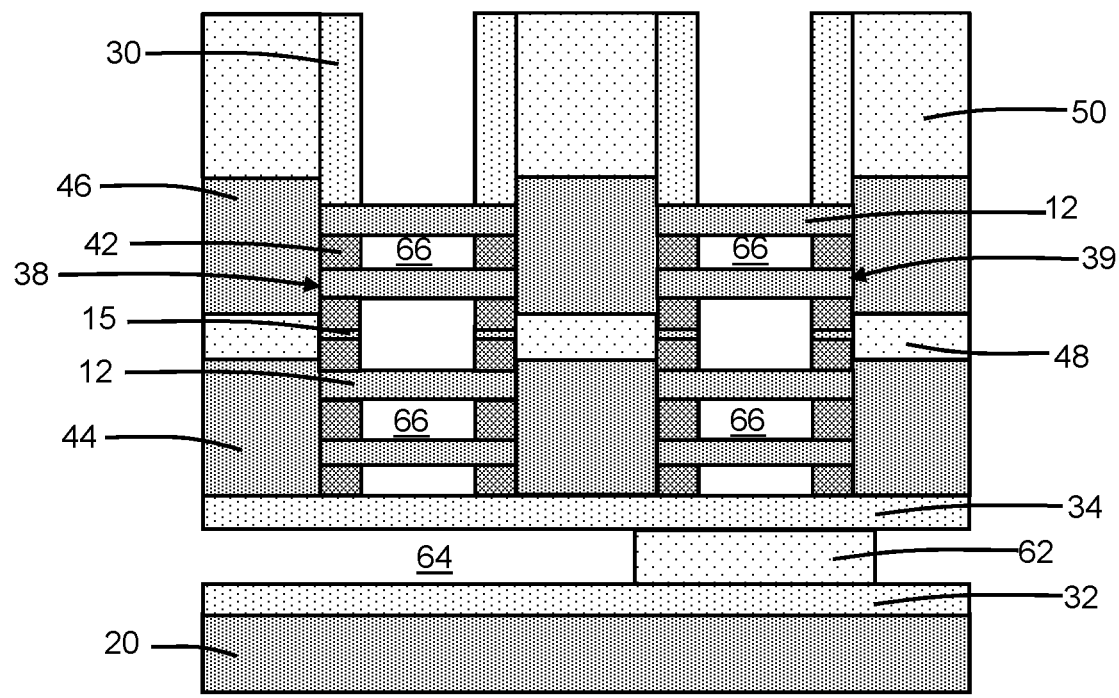
FIG. 12B is taken generally along line 12B-12B.
Figure 12C:
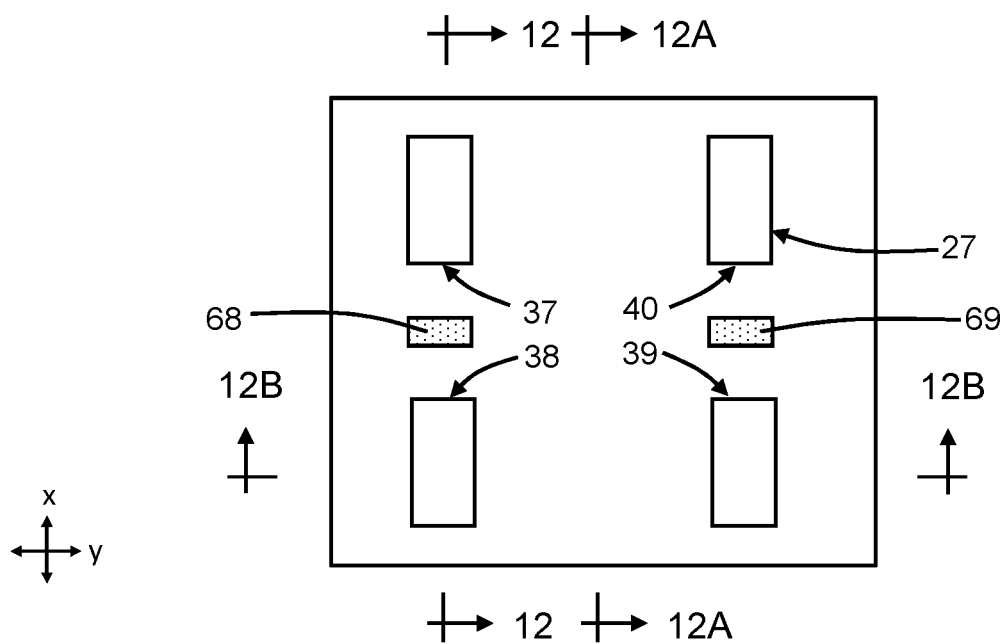
Figure 13:
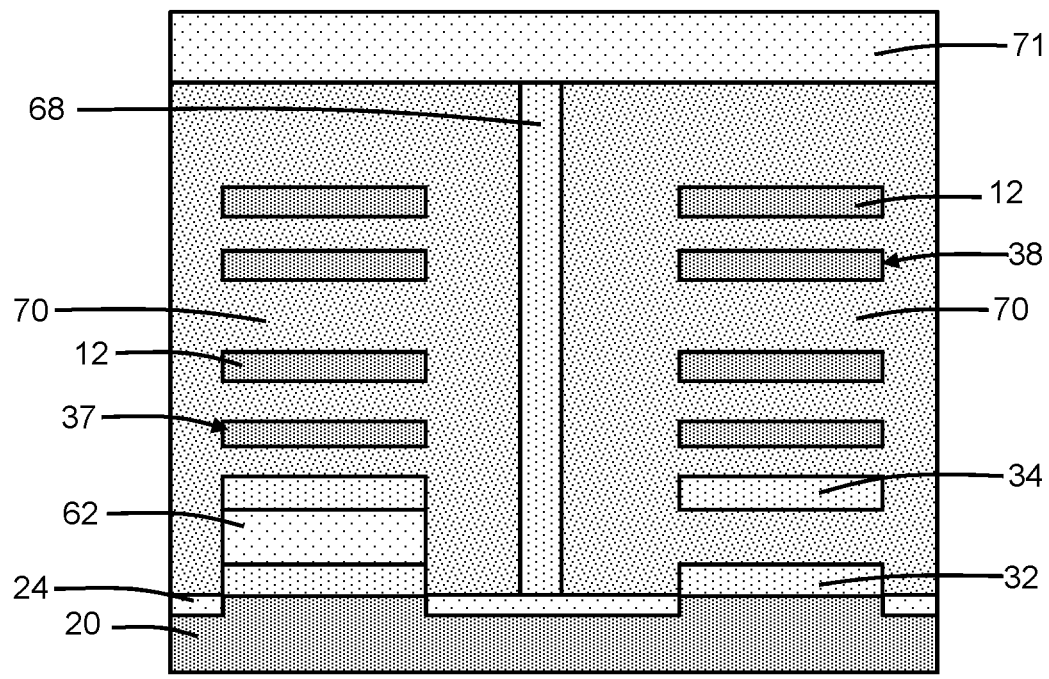
Figure 13A:
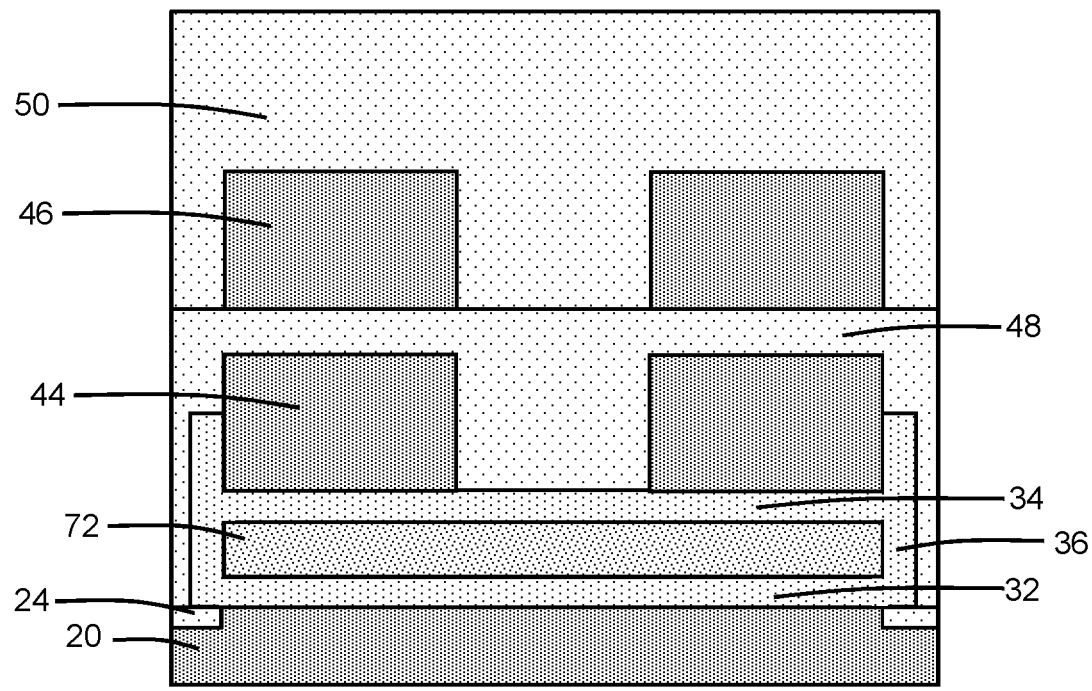
Figure 13B:
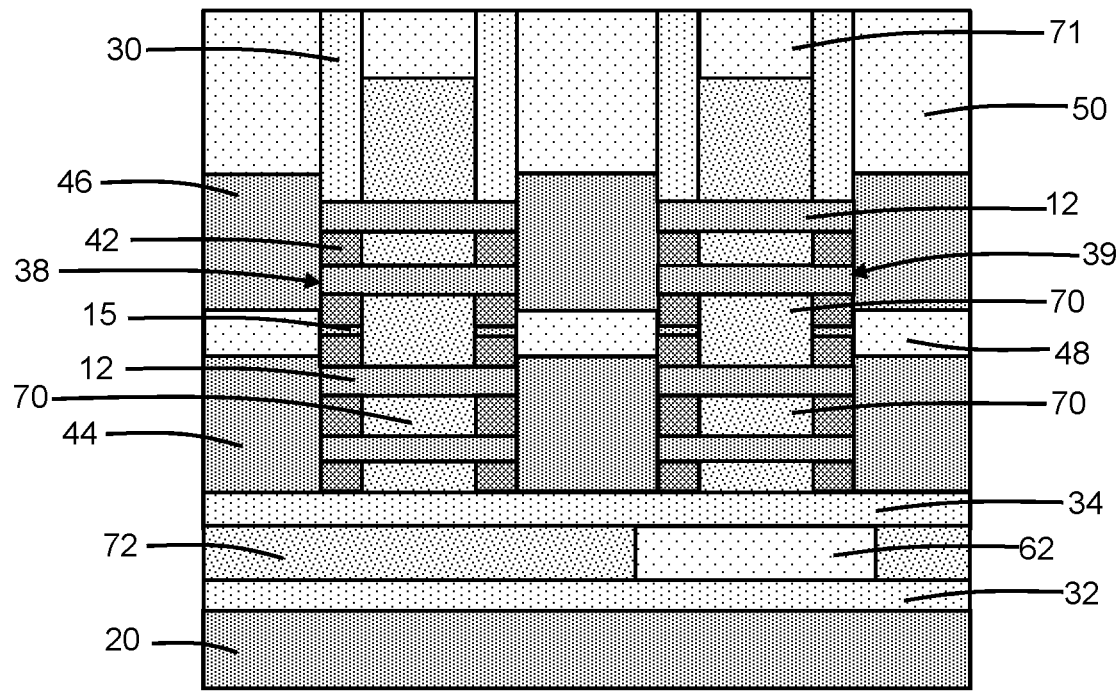

With reference to FIGS. 13, 13A, 13B in which like reference numerals refer to like features in FIGS. 12, 12A, 12B and at a subsequent fabrication stage of the processing method, sections of gate structures 70 are formed in the cavities 66 opened by the removal of the sacrificial layers 14. Each of the gate structures 70 may include a metal gate electrode, a gate dielectric layer composed of one or more dielectric materials, such as a high-k dielectric like hafnium oxide, and a thin oxide layer on the exterior surfaces of the nanosheet channel layers 12. The gate dielectric layer is arranged between the metal gate electrode and the thin oxide layer on the exterior surfaces of the nanosheet channel layers 12. The metal gate electrode includes one or more conformal barrier metal layers and/or work function metal layers, such as layers composed of titanium aluminum carbide (TiAlC) and/or titanium nitride (TiN), and a metal gate fill layer composed of a conductor, such as tungsten (W). A gate cap 71 composed of a dielectric material, such as silicon nitride, is formed over each of the gate structures 70. The gate electrodes of the gate structures 70 surround the nanosheet channel layers 12 on all sides with in a gate-all-around arrangement, and the nanosheet channel layers 12 of each of the fins 37, 38, 39, 40 define active channels in which carrier flow occurs during operation.

One of the gate structures 70 is associated with fin 37 to define a pass-gate field-effect transistor. One of the gate structures 70 is associated with fin 38 to define a complementary field-effect transistor with a pull-up transistor and a pull-down transistor having a stacked arrangement of source/drain regions 44, 46 and a shared gate structure 70. The buried cross-couple interconnect 72 is coupled with this shared gate structure 70 beneath the active channels defined by the nanosheet channel layers 12 that are surrounded by this shared gate structure 70. One of the gate structures 70 is associated with fin 39 to define another pass-gate field-effect transistor. One of the gate structures 70 is associated with fin 40 to define another complementary field-effect transistor with both a pull-up transistor and a pull-down transistor having a stacked arrangement of source/drain regions 44, 46 and a shared gate structure 70.

The dielectric pillar 68 (FIGS. 12, 12C) is arranged between the gate electrode of the gate structure 70 associated with fin 37 and the gate electrode of the gate structure 70 associated with fin 38 as a gate cut. The dielectric pillar 69 (FIG. 12C) is arranged between the gate electrode of the gate structure 70 associated with fin 39 and the gate electrode of the gate structure 70 associated with fin 40 as a gate cut.

A buried cross-couple interconnect 72 is formed in the cavity 64 and is directly coupled with the gate structure 70 associated with the fin 38. In an embodiment, the dielectric material of the gate dielectric layer and the conductor of the gate electrode sequentially deposited to form the gate structure 70 also deposit in the cavity 64 to define the buried cross-couple interconnect 72. The dielectric layers 62 prevent the buried cross-couple interconnect 72 from being connected with the gate structures 70 associated with the fins 37, 39, and 40, and thereby electrically isolate all of these particular gate structures 70 from the buried cross-couple interconnect 72. The buried cross-couple interconnect 72 is arranged in a vertical direction beneath the gate structure 70 associated with the fin 38 and is also arranged in the vertical direction beneath the source/drain regions 44. The dielectric layer 34 prevents the buried cross-couple interconnect 72 from being directly connected with the source/drain regions 44, and thereby electrically isolates the particular source/drain regions 44 from the buried cross-couple interconnect 72.

With reference to FIGS. 14, 14A, 14B, 14C in which like reference numerals refer to like features in FIGS. 13, 13A, 13B and at a subsequent fabrication stage of the processing method, a contact opening 76 for a source/drain contact is formed with lithography and etching processes. The contact opening 76 extends in a vertical direction to expose a side surface 43 of the source/drain region 44 associated with the fins 37 and 40 and a side surface 45 of the source/drain region 46 associated with the fins 37 and 40. The depth of the contact opening 76 extends below the depth of the lower source/drain region 44 and the dielectric layer 34. As a result, a portion of the dielectric layer 36 is exposed by the contact opening 76, which permits the one or more etching processes to remove this portion of the dielectric layer 36 inside the contact opening 76. The partial removal of the dielectric layer 36 exposes a side surface 73 of the buried cross-couple interconnect 72 at the base of the contact opening 76. The gate dielectric material is removed from the side surface 73 of the conductor of the buried cross-couple interconnect 72 with an etching process.

A contact opening 78 for another source/drain contact is formed with lithography and etching processes. The contact opening 78 extends in a vertical direction to expose the source/drain region 46 and to partially expose the source/drain region 44 associated with the fins 38 and 39. The contact opening 78 extends to a shallower depth than the contact opening 76 such that the dielectric layer 36 is not removed. As a consequence, an opposite side surface of the buried cross-couple interconnect 72 is not exposed.

Figure 14:
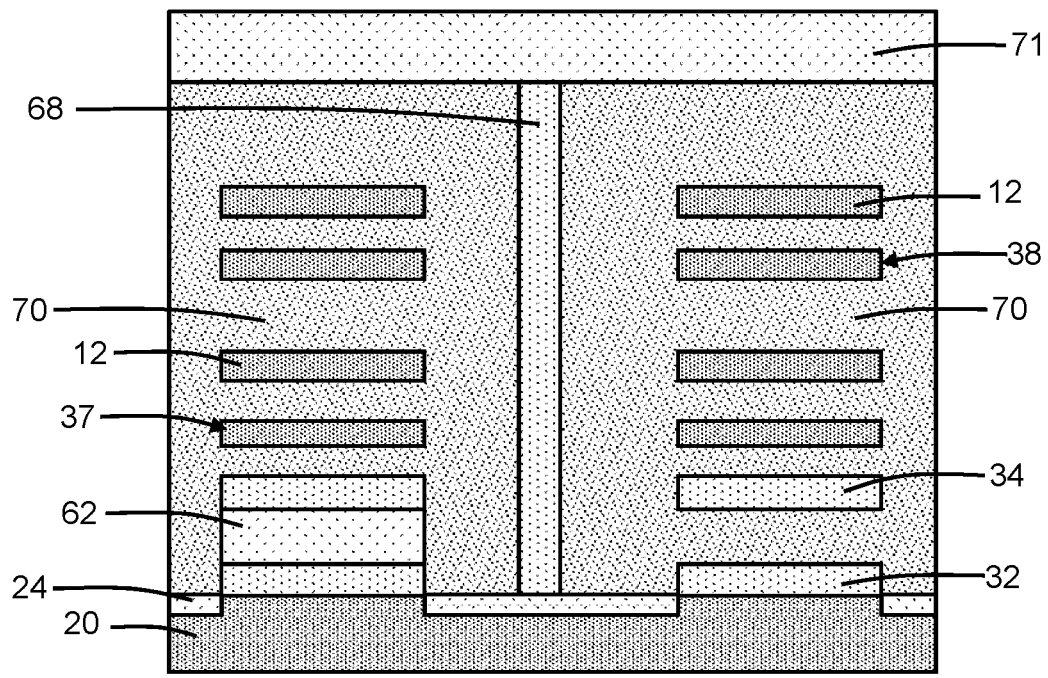
Figure 14A:
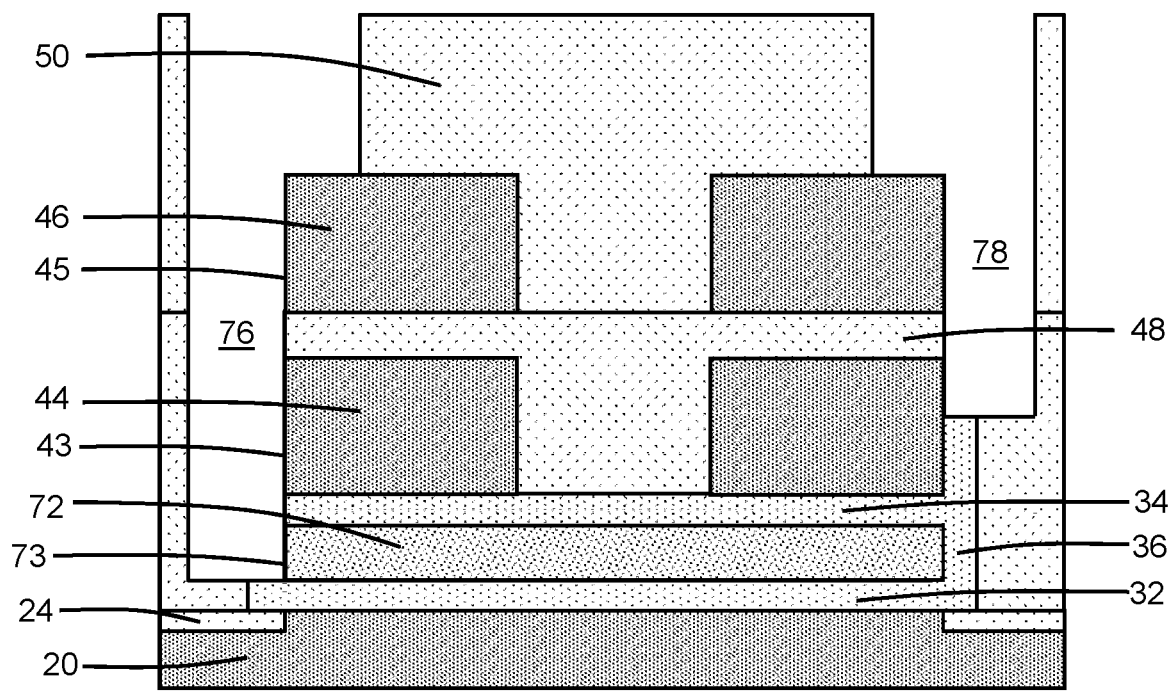
FIG. 14A is taken generally along line 14A-14A.
Figure 14B:
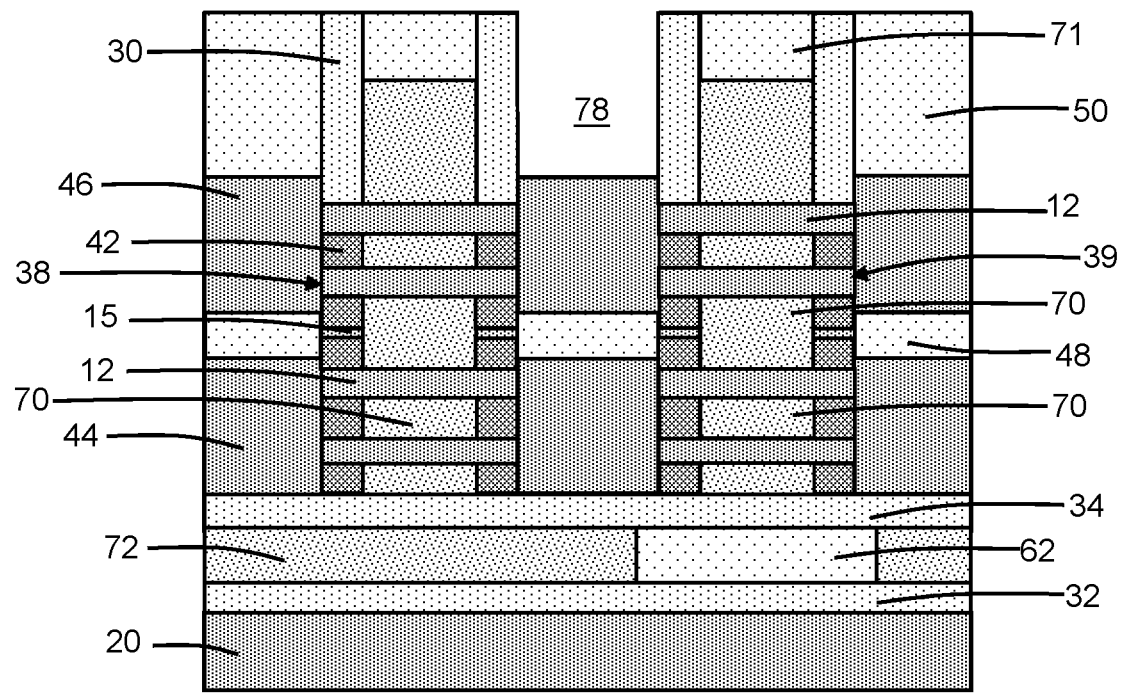
FIG. 14B is taken generally along line 14B-14B.
Figure 14C:
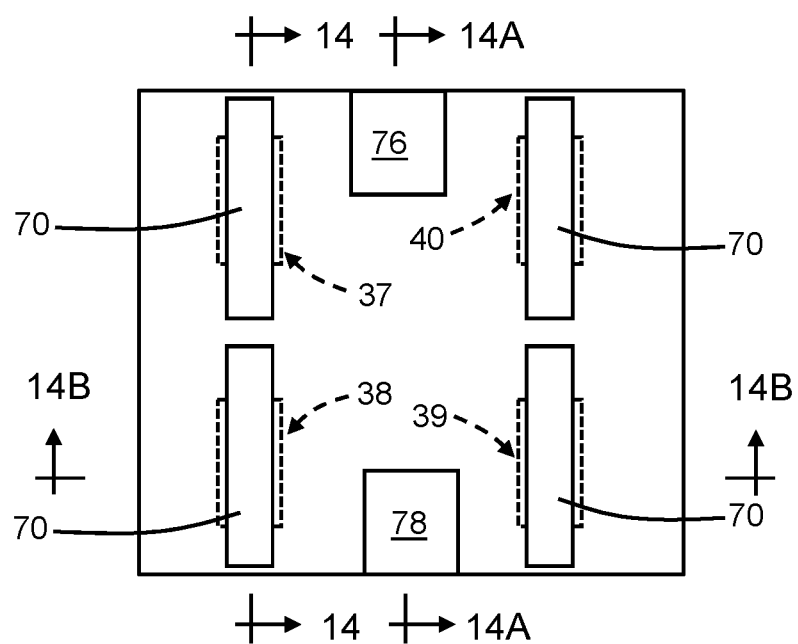
Figure 15:
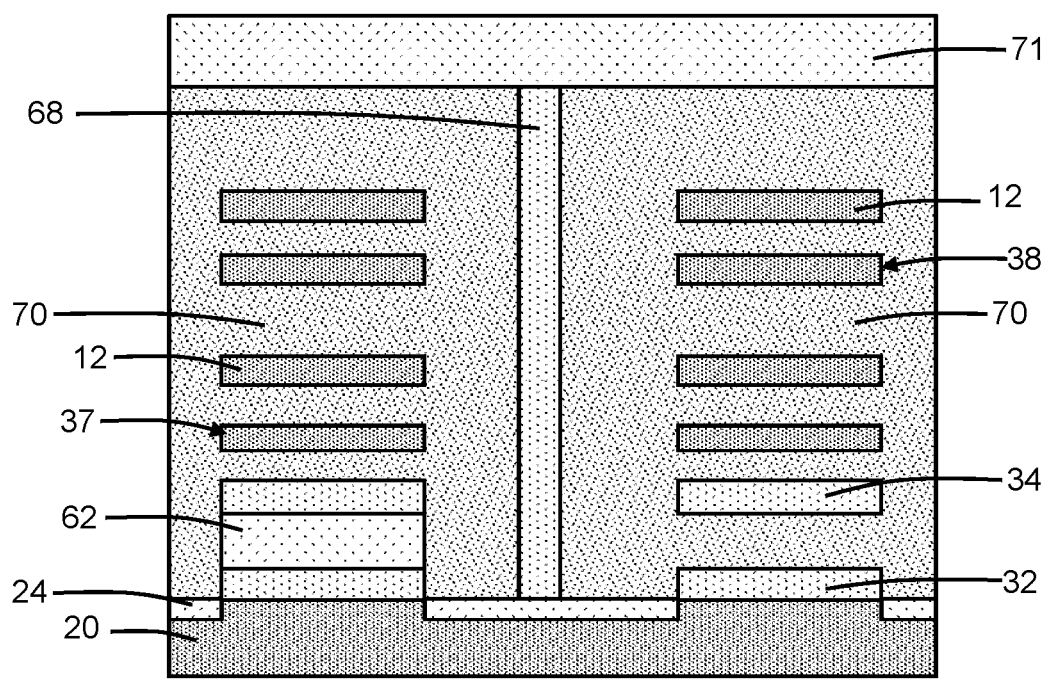
Figure 15A:
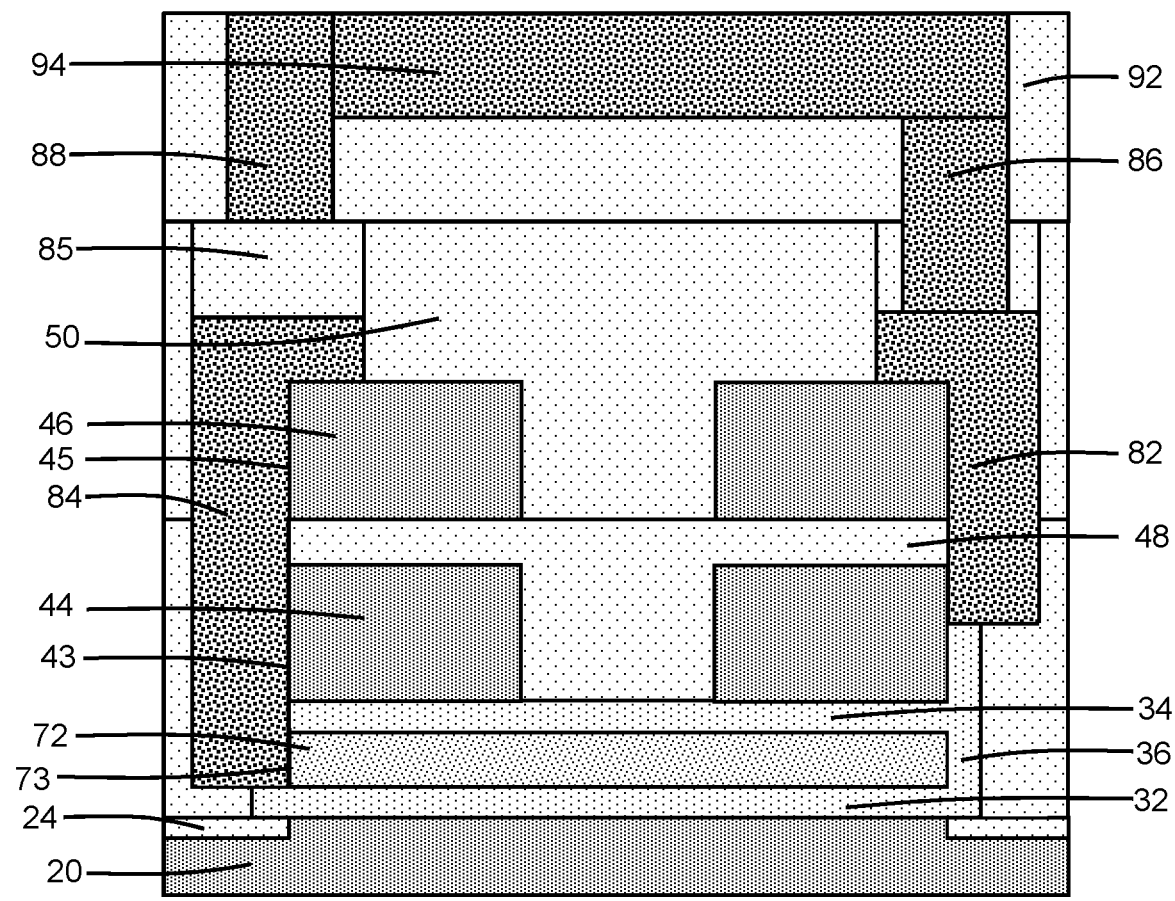
Figure 15B:
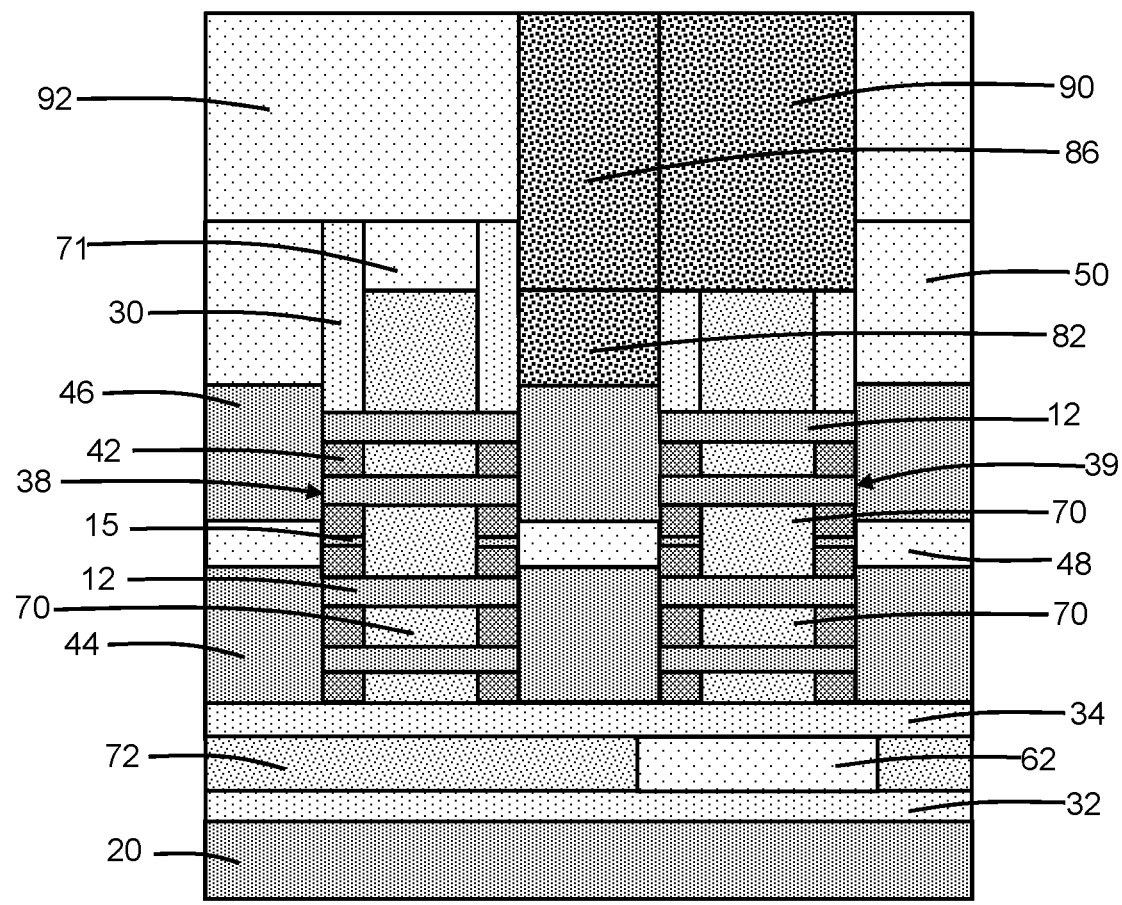

With reference to FIGS. 15, 15A, 15B in which like reference numerals refer to like features in FIGS. 14, 14A, 14B and at a subsequent fabrication stage of the processing method, contacts 82, 84 are formed in the contact openings 76, 78. The contacts 82, 84 may include a metal silicide, such as tungsten silicide, titanium silicide, nickel silicide, or cobalt silicide. Caps 85 are formed over the contacts 82, 84 and may be composed of a dielectric material, such as silicon carbide.

The contact 82 extends vertically to wrap about, and to be coupled with, the source/drain regions 44, 46 associated with the fins 38 and 39. The contact 84 extends vertically to wrap about, and to be coupled with, the respective side surfaces 43, 45 of the source/drain regions 44, 46 that are associated with the fins 37 and 40. Due to the depth of the contact opening 76, the contact 84 is in direct contact with the side surface 73 of the buried cross-couple interconnect 72, which establishes an electrical and physical connection between the contact 84 and the buried cross-couple interconnect 72. The contact 84 participates in forming the cross-couple connection between the gate electrode of the gate structure 70 associated with the fin 38 and the source/drain regions 44, 46 associated with the fins 37 and 40. The cross-couple connection is established without reliance upon metallization in the middle-of-line and back-end-of-line levels.

Contacts 86, 88, 90 are formed in one or more interlayer dielectric layers 92 formed over the contacts 82, 84. The contacts 86, 88, 90 may be formed by lithography and etching processes in the one or more interlayer dielectric layers 92. The contact 86 couples a metal line 94 with the source/drain contact 82, and a contact 88 couples the metal line 94 with the gate electrode of the gate structure 70 associated with the fin 40. The contact 90 is coupled with the gate structure 70 associated with the fin 39, and is in contact with the contact 86 to provide an electrical connection. The contacts 82, 86, 88, 90 and metal line 94 participate in forming another cross-couple connection. The cap 85 over the contact 82 isolates contact 82 from the contact 88.

Figure 16:
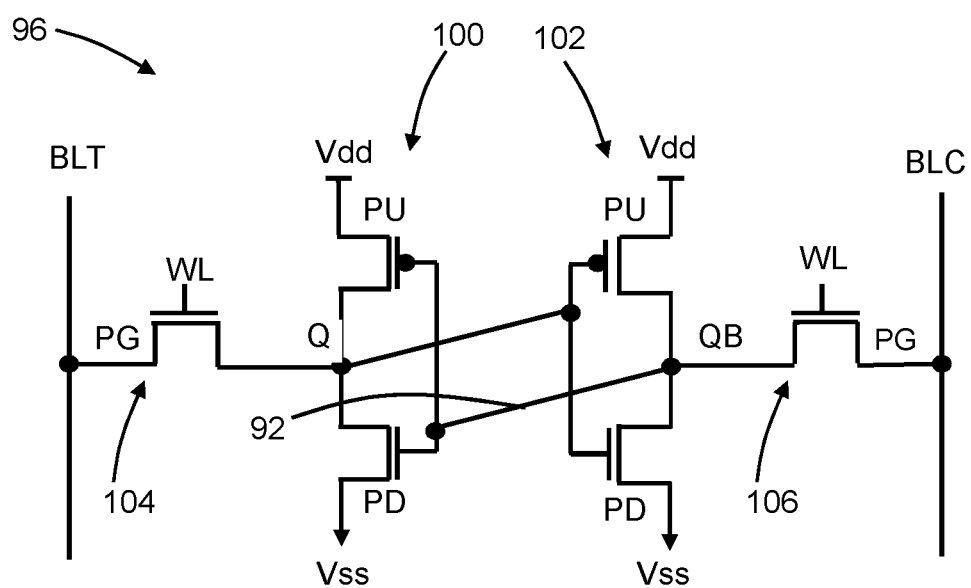
FIG. 16 is a circuit diagram of a 6-transistor SRAM bitcell constructed using the field-effect transistors.

With reference to FIG. 16, the device structures formed using the fins 37, 38, 39, 40 may be included in a six transistor (6-T) static random access memory (SRAM) bit cell 96 of an SRAM memory device. The SRAM bit cell 96 may belong to a much larger array of SRAM bit cells that are identical to the SRAM bit cell 96. The source/drain regions 44 are located in a layer that is arranged in a vertical direction below a layer that includes source/drain regions 46 with the dielectric layer 48 intervening between the adjacent layers. One of the source/drain regions 46 is stacked over one of the source/drain regions 44 in association with the fins 38 and 40 to define stacked nanosheet transistor pairs belonging to respective complementary field-effect transistors (CFETs) 100, 102. In each of the CFETS 100, 102, the lower source/drain region 44 contributes to forming a lower field-effect transistor of an inverter and the upper source/drain region 46 contributes to forming an upper nanosheet field-effect transistor of an inverter, and these inverters provide storage in the SRAM bit cell 96. In an embodiment, the field-effect transistors associated with the lower source/drain regions 44 of the CFETs 100, 102 may be characterized as pull-down (PD) transistors of the SRAM bit cell 96, and the field-effect transistors associated with the upper source/drain regions 46 of the CFETs 100, 102 may be pull-up (PU) transistors of the SRAM bit cell 96. The field-effect transistors 104, 106 respectively associated with fins 37 and 39 may constitute access or pass-gate transistors of the SRAM bit cell 96 that control access to the inverters during read and write operations.

A bit line (BLT) is connected with a drain of the field-effect transistor 104, and a complementary bit line (BLC) is connected with a drain of the field-effect transistor 106. The gates of the field-effect transistors 104, 106 are each connected with a wordline (WL). The source/drain regions 46 of the CFETs 100, 102 are connected with a positive supply voltage ($V_{DD}$), and the source/drain regions 44 of the CFETs 100, 102 are connected with a negative supply voltage ($V_{SS}$), which may be ground.

The utilization of the buried cross-couple interconnect 72 in forming one of the cross-couple connections of the SRAM bit cell 96 may eliminate the need for complex patterning of the epitaxial semiconductor material of the source/drain regions 44, 46 in order to provide one of the cross-couple connections. In addition, the upper source/drain region 46 of the pass-gate field-effect transistors 104, 106 does not have to be removed. The utilization of the buried cross-couple interconnect 72 also enables the formation of self-aligned gate cuts lacking an asymmetrical offset, which may increase the scalability of the SRAM bit cell 96.

The utilization of the buried cross-couple interconnect 72 may also permit the construction of a more compact bit cell 96.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first field-effect transistor including a gate electrode;
   a second field-effect transistor including a first source/drain region; and
   a buried cross-couple interconnect arranged in a vertical direction beneath the first field-effect transistor and the second field-effect transistor, the buried cross-couple interconnect coupled with the gate electrode of the first field-effect transistor, and the buried cross-couple interconnect coupled with the first source/drain region of the second field-effect transistor,
wherein the first field-effect transistor is a component of a first inverter of a static random access memory bitcell, and the second field-effect transistor is a component of a second inverter of the static random access memory bitcell.

2. The structure of claim 1 wherein the second field-effect transistor includes a second source/drain region stacked in the vertical direction over the first source/drain region, the first source/drain region is comprised of a first semiconductor material, and the second source/drain region is comprised of a second semiconductor material having an opposite conductivity type from the first semiconductor material.

3. The structure of claim 2 wherein the buried cross-couple interconnect is further coupled with the second source/drain region of the second field-effect transistor.

4. The structure of claim 3 further comprising:
a dielectric layer over the first field-effect transistor and the second field-effect transistor; and
a contact in the dielectric layer, the contact extending in the vertical direction to couple the buried cross-couple interconnect with the second source/drain region of the second field-effect transistor.

5. The structure of claim 4 wherein the first source/drain region has a first side surface, the second source/drain region has a second side surface, the buried cross-couple interconnect has a third side surface, and the contact is directly coupled with the first side surface, the second side surface, and the third side surface.

6. The structure of claim 2 wherein the second field-effect transistor includes a nanosheet channel layer, and the nanosheet channel layer is surrounded by a portion of the gate electrode.

7. The structure of claim 1 wherein the first source/drain region has a side surface, the buried cross-couple interconnect has a side surface, and further comprising:
a contact extending in the vertical direction,
wherein the contact is coupled with the side surface of the buried cross-couple interconnect and the side surface of the first source/drain region.

8. The structure of claim 1 wherein the second field-effect transistor includes a gate electrode, and further comprising:
a third field-effect transistor including a gate electrode aligned with the gate electrode of the first field-effect transistor;
a fourth field-effect transistor including a gate electrode aligned with the gate electrode of the second field-effect transistor;
a first dielectric pillar arranged as a first cut between the gate electrode of the first field-effect transistor and the gate electrode of the third field-effect transistor; and
a second dielectric pillar arranged as a second cut between the gate electrode of the second field-effect transistor and the gate electrode of the fourth field-effect transistor;
wherein the first dielectric pillar and the second dielectric pillar are laterally aligned.

9. The structure of claim 1 wherein the first field-effect transistor includes an active channel, and the buried cross-couple interconnect is arranged in part beneath the active channel of the first field-effect transistor.

10. The structure of claim 9 wherein the active channel of the first field-effect transistor includes one or more nanosheet channel layers, and the gate electrode of the first field-effect transistor is arranged to surround each nanosheet channel layer.

11. The structure of claim 1 wherein the second field-effect transistor includes a gate electrode, and further comprising:
a dielectric layer arranged in a first portion of a cavity,
wherein the first portion of the cavity is arranged beneath the gate electrode of the second field-effect transistor, and the buried cross-couple interconnect is arranged in a second portion of the cavity arranged beneath the gate electrode of the first field-effect transistor.

12. A structure comprising:
a first field-effect transistor including a gate electrode;
a second field-effect transistor including a gate electrode and a first source/drain region;
a buried cross-couple interconnect arranged in a vertical direction beneath the first field-effect transistor and the second field-effect transistor, the buried cross-couple interconnect coupled with the gate electrode of the first field-effect transistor, and the buried cross-couple interconnect coupled with the first source/drain region of the second field-effect transistor; and
a first dielectric layer arranged in a first portion of a cavity,
wherein the first portion of the cavity is arranged beneath the gate electrode of the second field-effect transistor, and the buried cross-couple interconnect is arranged in a second portion of the cavity arranged beneath the gate electrode of the first field-effect transistor.

13. The structure of claim 12 further comprising:
a second dielectric layer arranged in the vertical direction between the cavity and a substrate.

14. The structure of claim 12 wherein the first field-effect transistor includes an active channel, and the buried cross-couple interconnect is arranged in part beneath the active channel of the first field-effect transistor.

15. A method comprising:
forming a first sacrificial layer, a second sacrificial layer, and a third sacrificial layer between the first sacrificial layer and the second sacrificial layer;
replacing the first sacrificial layer and the second sacrificial layer with a dielectric material to respectively form a first dielectric layer and a second dielectric layer;
replacing the third sacrificial layer with a conductor to form a buried cross-couple interconnect;
forming a gate electrode of a first field-effect transistor that is positioned over the buried cross-couple interconnect and coupled to the buried cross-couple interconnect;
forming a source/drain region of a second field-effect transistor over the second dielectric layer; and
forming a contact coupling the buried cross-couple interconnect with the source/drain region of the second field-effect transistor.

16. The method of claim 15 wherein replacing the third sacrificial layer with the conductor to form the buried cross-couple interconnect comprises:
removing the third sacrificial layer selective to the first dielectric layer and the second dielectric layer with an etching process to define a cavity; and
depositing the conductor that forms the buried cross-couple interconnect by filling the cavity,
wherein the gate electrode of the first field-effect transistor is also formed by the conductor that is deposited.

17. The method of claim 15 wherein replacing the first sacrificial layer and the second sacrificial layer with the dielectric material to respectively form the first dielectric layer and the second dielectric layer comprises:

removing the first sacrificial layer and the second sacrificial layer selective to the third sacrificial layer with an etching process to respectively define a first cavity and a second cavity; and conformally depositing the dielectric material to fill the first cavity and the second cavity.

18. The method of claim 15 wherein the second field-effect transistor includes a fin having a nanosheet channel layer coupled with the source/drain region and arranged over the first dielectric layer, and further comprising:

forming a first sidewall spacer arranged to cover a side surface of the nanosheet channel layer; and forming a second sidewall spacer arranged to cover a side surface of the third sacrificial layer, wherein the first sidewall spacer is stacked over the second sidewall spacer, the first sidewall spacer is comprised of a first dielectric material, and the second sidewall spacer is comprised of a second dielectric material different from the first dielectric material.

19. The method of claim 18 further comprising:

removing the second sidewall spacer selective to the first sidewall spacer to reveal the third sacrificial layer; and after removing the second sidewall spacer, oxidizing a portion of the third sacrificial layer.

20. The method of claim 15 wherein the third sacrificial layer is replaced with the conductor to form the buried cross-couple interconnect after the first sacrificial layer and the second sacrificial layer are replaced with the dielectric material.

\* \* \* \* \*